United States Patent
Itou et al.

(10) Patent No.: US 11,942,583 B2
(45) Date of Patent: Mar. 26, 2024

(54) DISPLAY DEVICE HAVING REFLECTIVE LAYER COUPLED TO LIGHT EMITTING ELEMENT

(71) Applicant: Japan Display Inc., Tokyo (JP)

(72) Inventors: Osamu Itou, Tokyo (JP); Masanobu Ikeda, Tokyo (JP)

(73) Assignee: Japan Display Inc., Tokyo (JP)

( * ) Notice: Subject to any disclaimer, the term of this patent is extended or adjusted under 35 U.S.C. 154(b) by 431 days.

(21) Appl. No.: 17/316,938

(22) Filed: May 11, 2021

(65) Prior Publication Data

US 2021/0265540 A1    Aug. 26, 2021

Related U.S. Application Data

(63) Continuation of application No. PCT/JP2019/036148, filed on Sep. 13, 2019.

(30) Foreign Application Priority Data

Nov. 12, 2018 (JP) .................................. 2018-212437

(51) Int. Cl.
    *H01L 33/00*    (2010.01)
    *H01L 25/16*    (2023.01)
    (Continued)

(52) U.S. Cl.
    CPC ............ *H01L 33/60* (2013.01); *H01L 25/167* (2013.01); *H01L 33/465* (2013.01); *H01L 33/502* (2013.01); *H01L 33/505* (2013.01); *H01L 33/54* (2013.01); *H01L 33/62* (2013.01); *H01L 24/29* (2013.01); *H01L 24/32* (2013.01); *H01L 2224/29139* (2013.01); *H01L 2224/32145* (2013.01)

(58) Field of Classification Search
    CPC ........ H01L 33/60; H01L 33/46; H01L 33/502; H01L 33/505; H01L 33/54
    See application file for complete search history.

(56) References Cited

U.S. PATENT DOCUMENTS

2015/0003040 A1    1/2015    Bessho et al.
2017/0139276 A1    5/2017    Ulmer et al.

FOREIGN PATENT DOCUMENTS

JP    2007-150228 A    6/2007
JP    2007150228 A  *  6/2007    ............. H01L 33/50
(Continued)

OTHER PUBLICATIONS

International Search Report of the ISA dated Dec. 10, 2019 in connection with PCT/JP2019/036148.
(Continued)

*Primary Examiner* — Reema Patel
(74) *Attorney, Agent, or Firm* — K&L Gates LLP

(57) ABSTRACT

A display device comprising: a first substrate; a plurality of pixels provided to the first substrate; a light emitting element provided to each of the pixels; a phosphor layer covering at least an upper surface of the light emitting element; a first reflective layer facing a side surface of the light emitting element; and a second reflective layer provided to a side surface of the phosphor layer, separated from the first reflective layer in a normal direction of the first substrate, and disposed farther away from the first substrate than the first reflective layer.

17 Claims, 22 Drawing Sheets

(51) Int. Cl.
  *H01L 33/46* (2010.01)
  *H01L 33/50* (2010.01)
  *H01L 33/54* (2010.01)
  *H01L 33/60* (2010.01)
  *H01L 33/62* (2010.01)
  H01L 23/00 (2006.01)

(56) References Cited

FOREIGN PATENT DOCUMENTS

| | | |
|---|---|---|
| JP | 2009-182241 A | 8/2009 |
| JP | 2010-066437 A | 3/2010 |
| JP | 2014-224836 A | 12/2014 |
| JP | 2017-063231 A | 3/2017 |

OTHER PUBLICATIONS

Japanese Office Action dated Oct. 18, 2022 in corresponding Japanese Application No. 2018-212437.

* cited by examiner

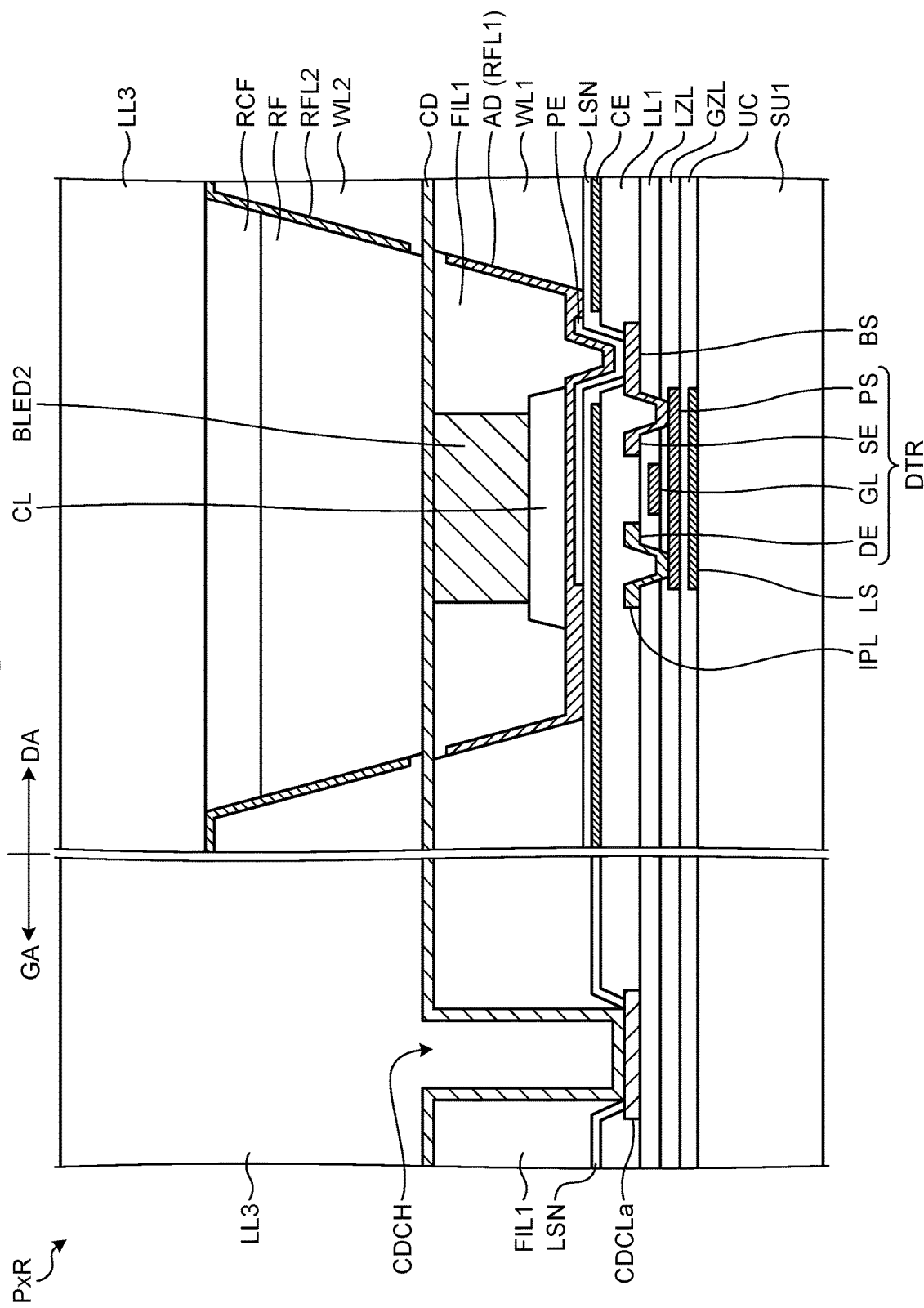

DISPLAY DEVICE HAVING REFLECTIVE LAYER COUPLED TO LIGHT EMITTING ELEMENT

CROSS-REFERENCE TO RELATED APPLICATION

This application is a continuation of PCT international application Ser. No. PCT/JP2019/036148 filed on Sep. 13, 2019, which designates the United States, incorporated herein by reference, and which claims the benefit of priority from Japanese Patent Application No. 2018-212437 filed on Nov. 12, 2018, incorporated herein by reference.

BACKGROUND

1. Technical Field

The present disclosure relates to a display device.

2. Description of the Related Art

Widely known are display devices including organic light emitting diodes (OLED) or inorganic light emitting diodes (micro LEDs) serving as display elements. Micro LEDs are suitably used as light emitting elements for display devices because they are small in size and have high luminance. The display device described in U.S. Unexamined Patent Application Publication No. 2017-0139276 (US-A-2017-0139276) uses blue light emitting diodes for pixels that display red or green. Light output from the blue light emitting diodes is converted into red or green light by a light conversion structure. Japanese Patent Application Laid-open Publication No. 2010-66437 (JP-A-2010-66437) describes a liquid crystal display device including blue light emitting diodes as light sources.

Display devices including micro LEDs are expected to have higher light extraction efficiency. If the light conversion structure described in US-A-2017-0139276 is made of a phosphor, the display device may possibly have lower light extraction efficiency on the display surface because the phosphor isotropically emits light. JP-A-2010-66437 discloses a liquid crystal display device and does not describe a configuration including micro LEDs serving as display elements.

An object of the present disclosure is to provide a display device having higher light extraction efficiency.

SUMMARY

A display device according an aspect of the present disclosure comprising: a first substrate; a plurality of pixels provided to the first substrate; a light emitting element provided to each of the pixels; a phosphor layer covering at least an upper surface of the light emitting element; a first reflective layer facing a side surface of the light emitting element; and a second reflective layer provided to a side surface of the phosphor layer, separated from the first reflective layer in a normal direction of the first substrate, and disposed farther away from the first substrate than the first reflective layer.

BRIEF DESCRIPTION OF THE DRAWINGS

FIG. 27 is a sectional view of the display device according to a tenth modification of the sixth embodiment.

DETAILED DESCRIPTION

Figure 1:
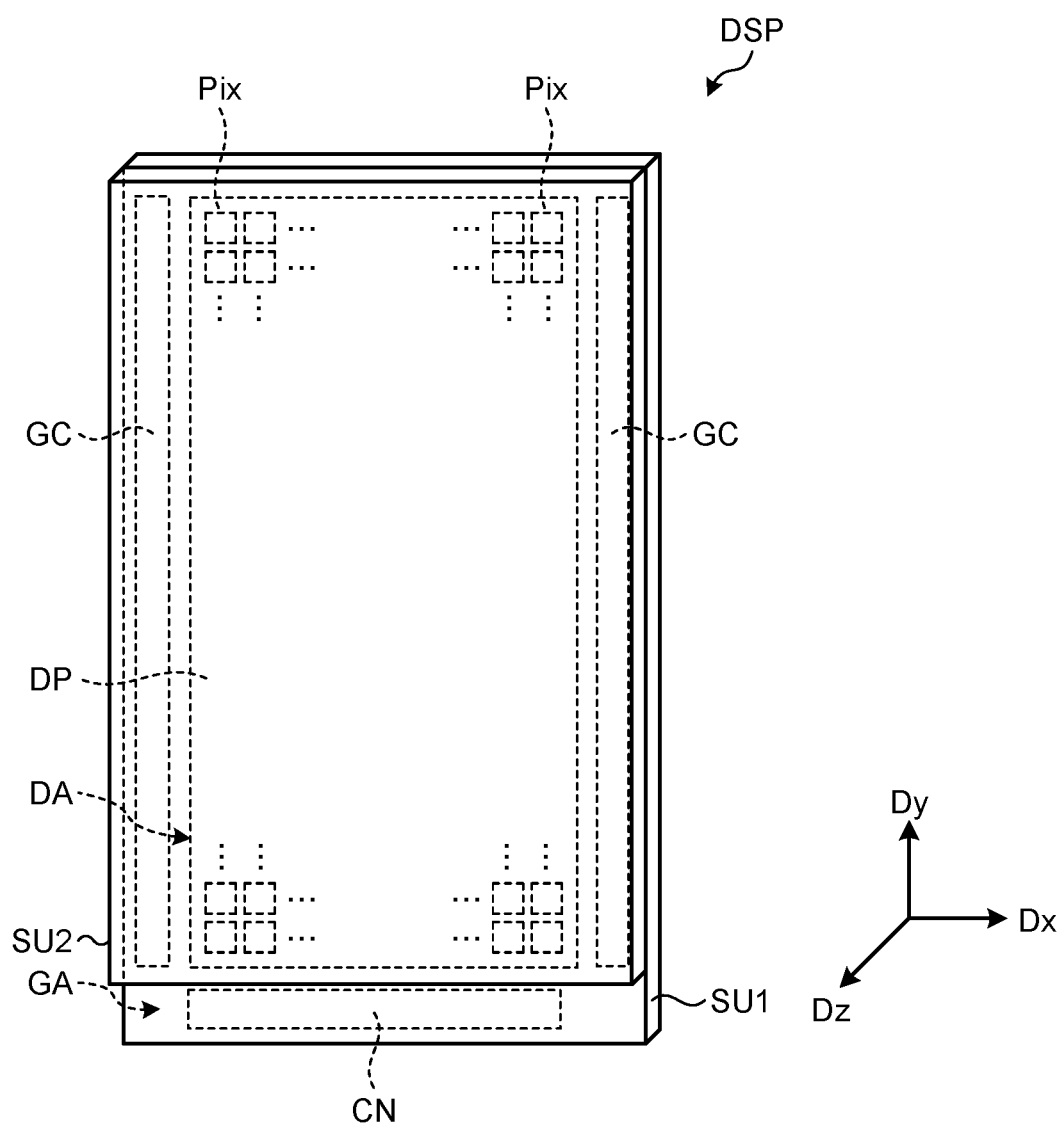
FIG. 1 is a perspective view schematically illustrating a display device according to a first embodiment.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by like reference numerals, and detailed explanation thereof may be appropriately omitted.

First Embodiment

FIG. 1 is a perspective view schematically illustrating a display device according to a first embodiment. As illustrated in FIG. 1, a display device DSP includes a first substrate SU1, a second substrate SU2, pixels Pix, peripheral circuits GC, and a coupler CN. FIG. 1 illustrates the configuration on the first substrate SU1 in a transparent manner. The first substrate SU1, a plurality of transistors, a plurality of capacitances, various kinds of wiring, and other components constitute an array substrate SUA that drives the pixels Pix. The array substrate SUA is a drive circuit board and is also called a backplane or an active matrix substrate. A drive integrated circuit (IC) is coupled to the array substrate SUA via the coupler CN.

As illustrated in FIG. 1, the display device DSP has a display region DA and a peripheral region GA. The display region DA overlaps a display portion DP and displays an image. The peripheral region GA does not overlap the display portion DP and is disposed outside the display region DA. The second substrate SU2 overlaps the first substrate SU1 in the display portion DP.

The display portion DP includes a plurality of pixels Pix. The pixels Pix are arrayed in a first direction Dx and a second direction Dy in the display region DA. The first direction Dx and the second direction Dy are parallel to the surface of the first substrate SU1. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the first substrate SU1, for example. In the following description, planar view indicates the positional relation when viewed in the third direction Dz.

The peripheral circuits GC and the coupler CN are provided in the peripheral region GA. The coupler CN is provided in a region not overlapping the second substrate SU2 in the peripheral region GA. The peripheral circuits GC drive a plurality of gate lines (e.g., a reset control signal line RSL, an output control signal line MSL, a pixel control signal line SSL, and an initialization control signal line ISL (refer to FIG. 3)) based on various control signals received from the drive IC. The peripheral circuits GC sequentially or simultaneously select a plurality of gate lines and supply gate drive signals to the selected gate lines. As a result, the peripheral circuits GC select a plurality of pixels Pix coupled to the gate lines.

The drive IC is a circuit that controls display on the display device DSP. The drive IC may be mounted on FPCs or a rigid substrate coupled to the coupler CN of the first substrate SU1 as chip on film (COF). The mounting form of the drive IC is not limited thereto, and the drive IC may be mounted on the peripheral region GA of the first substrate SU1 as chip on glass (COG).

Figure 2:
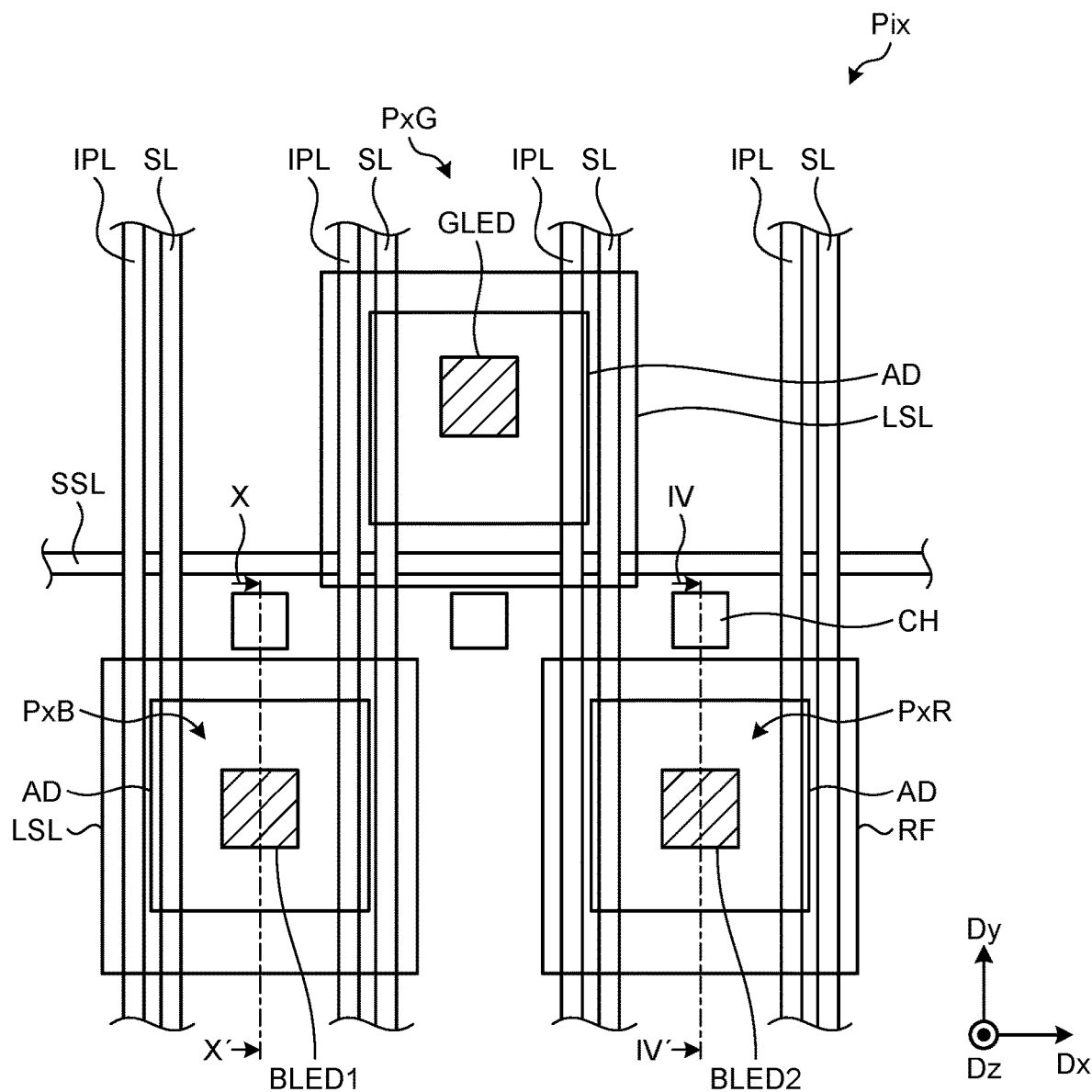
FIG. 2 is a plan view of a plurality of pixels.

FIG. 2 is a plan view of a plurality of pixels. As illustrated in FIG. 2, one pixel Pix includes a first pixel PxR, a second pixel PxG, and a third pixel PxB, for example. The first pixel PxR displays a primary color of red as the first color. The second pixel PxG displays a primary color of green as the second color. The third pixel PxB displays a primary color of blue as the third color. As illustrated in FIG. 2, the first pixel PxR, the second pixel PxG, and the third pixel PxB are disposed side by side in the first direction Dx in one pixel Pix. The first color, the second color, and the third color are not limited to red, green, and blue, respectively, and may be any desired colors, such as complementary colors. In the following description, the first pixel PxR, the second pixel PxG, and the third pixel PxB are referred to as pixels Px when they need not be distinguished from one another.

The first pixel PxR includes a second blue light emitting element BLED2, an anode electrode AD, and a phosphor layer RF. The second blue light emitting element BLED2 outputs blue light. The phosphor layer RF converts the wavelength of light output from the second blue light emitting element BLED2 and outputs red light. The second pixel PxG includes a green light emitting element GLED, the anode electrode AD, and a light scattering layer LSL. The green light emitting element GLED outputs green light. The light scattering layer LSL scatters light output from the green light emitting element GLED. The third pixel PxB includes a first blue light emitting element BLED1, the anode electrode AD, and the light scattering layer LSL. The first blue light emitting element BLED1 outputs blue light. The light scattering layer LSL scatters light output from the first blue light emitting element BLED1.

The first pixel PxR according to the present embodiment is provided as a combination of the second blue light emitting element BLED2 and the phosphor layer RF. The second blue light emitting element BLED2 has higher luminous efficacy than a red light emitting element. Consequently, the display device DSP has higher luminous efficacy as a whole than in a case where the red light emitting element is used for the first pixel PxR.

FIG. 2 illustrates video signal lines SL, anode power supply lines IPL, and a pixel control signal line SSL out of various kinds of wiring of a pixel circuit PICA. The video signal lines SL and the anode power supply lines IPL extend in the second direction Dy. A plurality of pairs of the video signal line SL and the anode power supply line IPL are disposed side by side in the first direction Dx. The pixel control signal line SSL extends in the first direction Dx and intersects the video signal lines SL and the anode power supply lines IPL in planar view. A contract hole CH is formed in a grid surrounded by the pairs of the video signal line SL and the anode power supply line IPL and the pixel control signal line SSL. A plurality of contact holes CH are arrayed in the first direction Dx.

In FIG. 2, the first blue light emitting element BLED1 and the second blue light emitting element BLED2 are disposed on one side in the second direction Dy with respect to the array of the contact holes CH, and the green light emitting element GLED is disposed on the other side in the second direction Dy. In other words, the contact holes CH and the pixel control signal line SSL are provided between the green light emitting element GLED and the group of the first blue light emitting element BLED1 and the second blue light emitting element BLED2. In the following description, the first blue light emitting element BLED1, the second blue light emitting element BLED2, and the green light emitting element GLED are referred to as light emitting elements LED when they need not be distinguished from one another.

The first pixel PxR, the second pixel PxG, and the third pixel PxB are each provided as a combination of the light emitting element LED and the phosphor layer RF or the light scattering layer LSL. The display device DSP displays an image by causing the first pixel PxR, the second pixel PxG, and the third pixel PxB to output different light. The light emitting element LED is an inorganic light emitting diode (LED) chip having a size of approximately 3 μm to 100 μm in planar view and is called a micro LED. The display device DSP including the micro LEDs in the respective pixels is also called a micro LED display device. The term "micro" of the micro LED is not intended to limit the size of the light emitting element LED.

The positions of the pixels Px and the light emitting elements LED are not limited to the configuration illustrated in FIG. 2. The first blue light emitting element BLED1, the second blue light emitting element BLED2, and the green light emitting element GLED may be disposed side by side in the first direction Dx. Alternatively, the first blue light emitting element BLED1 and the second blue light emitting element BLED2 may be disposed side by side in the first direction Dx, and the green light emitting element GLED and the first blue light emitting element BLED1 may be disposed side by side in the second direction Dy.

The light emitting element LED is coupled to the anode electrode AD. The anode electrode AD extends from the inside to the outside of the light emitting element LED in planar view and is provided around the light emitting element LED. The phosphor layer RF and the light scattering layer LSL are each provided in a region overlapping the anode electrode AD in planar view.

Figure 3:
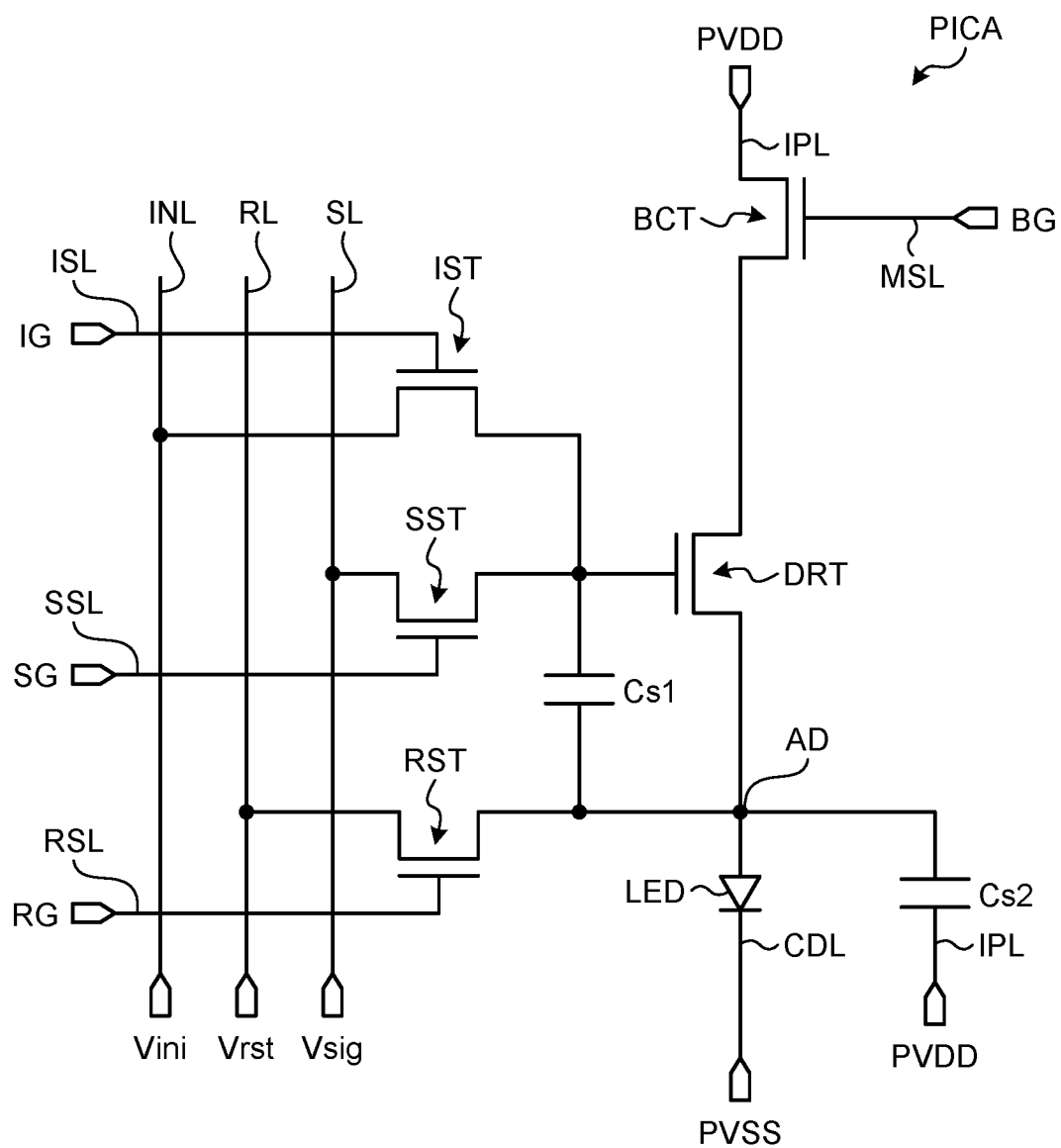
FIG. 3 is a circuit diagram of a pixel circuit.

FIG. 3 is a circuit diagram of a pixel circuit. FIG. 3 illustrates a pixel circuit PICA provided to one pixel Px. The pixel circuit PICA is provided to each of the pixels Px. As illustrated in FIG. 3, the pixel circuit PICA includes the light emitting element LED, five transistors, and two capacitances. Specifically, the pixel circuit PICA includes a drive transistor DRT, an output transistor BCT, an initialization transistor IST, a pixel selection transistor SST, and a reset transistor RST. The drive transistor DRT, the output transistor BCT, the initialization transistor IST, the pixel selection transistor SST, and the reset transistor RST are n-type thin-film transistors (TFTs). The pixel circuit PICA includes first capacitance Cs1 and second capacitance Cs2.

The cathode (cathode terminal ELED2 (refer to FIG. 5)) of the light emitting element LED is coupled to a cathode power supply line CDL. The anode (anode terminal ELED1 (refer to FIG. 5)) of the light emitting element LED is coupled to an anode power supply line IPL via the drive transistor DRT and the output transistor BCT. The anode power supply line IPL is supplied with an anode power supply potential PVDD. The cathode power supply line CDL is supplied with a cathode power supply potential PVSS. The anode power supply potential PVDD is higher than the cathode power supply potential PVSS.

The anode power supply line IPL supplies the anode power supply potential PVDD serving as a drive potential to the pixel Px. Specifically, the light emitting element LED emits light by being supplied with a forward current (drive current) by a potential difference (PVDD-PVSS) between the anode power supply potential PVDD and the cathode power supply potential PVSS. In other words, the anode power supply potential PVDD has a potential difference to cause the light emitting element LED to emit light with respect to the cathode power supply potential PVSS. The anode terminal ELED1 of the light emitting element LED is coupled to the anode electrode AD. The second capacitance Cs2 serving as an equivalent circuit is coupled between the anode electrode AD and the anode power supply line IPL.

The source electrode of the drive transistor DRT is coupled to the anode terminal ELED1 of the light emitting element LED via the anode electrode AD, and the drain electrode thereof is coupled to the source electrode of the output transistor BCT. The gate electrode of the drive transistor DRT is coupled to the first capacitance Cs1, the drain electrode of the pixel selection transistor SST, and the drain electrode of the initialization transistor IST.

The gate electrode of the output transistor BCT is coupled to the output control signal line MSL. The output control signal line MSL is supplied with an output control signal BG. The drain electrode of the output transistor BCT is coupled to the anode power supply line IPL.

The source electrode of the initialization transistor IST is coupled to an initialization power supply line INL. The initialization power supply line INL is supplied with an initialization potential Vini. The gate electrode of the initialization transistor IST is coupled to the initialization control signal line ISL. The initialization control signal line ISL is supplied with an initialization control signal IG. In other words, the gate electrode of the drive transistor DRT is coupled to the initialization power supply line INL via the initialization transistor IST.

The source electrode of the pixel selection transistor SST is coupled to a video signal line SL. The video signal line SL is supplied with a video signal Vsig. The gate electrode of the pixel selection transistor SST is coupled to the pixel control signal line SSL. The pixel control signal line SSL is supplied with a pixel control signal SG.

The source electrode of the reset transistor RST is coupled to a reset power supply line RL. The reset power supply line RL is supplied with a reset power supply potential Vrst. The gate electrode of the reset transistor RST is coupled to the reset control signal line RSL. The reset control signal line RSL is supplied with a reset control signal RG. The drain electrode of the reset transistor RST is coupled to the anode terminal ELED1 of the light emitting element LED and the source electrode of the drive transistor DRT.

The first capacitance Cs1 serving as an equivalent circuit is provided between the drain electrode of the reset transistor RST and the gate electrode of the drive transistor DRT. The pixel circuit PICA can prevent fluctuations in the gate voltage due to parasitic capacitance and current leakage in the drive transistor DRT by the first capacitance Cs1 and the second capacitance Cs2.

The gate electrode of the drive transistor DRT is supplied with an electric potential corresponding to the video signal Vsig (or gradation signal). In other words, the drive transistor DRT supplies an electric current corresponding to the video signal Vsig to the light emitting element LED based on the anode power supply potential PVDD supplied via the output transistor BCT. As described above, the anode power supply potential PVDD supplied to the anode power supply line IPL is lowered by the drive transistor DRT and the output transistor BCT. As a result, an electric potential lower than the anode power supply potential PVDD is supplied to the anode terminal ELED1 of the light emitting element LED.

A first electrode of the second capacitance Cs2 is supplied with the anode power supply potential PVDD via the anode power supply line IPL, and a second electrode of the second capacitance Cs2 is supplied with an electric potential lower than the anode power supply potential PVDD. In other words, the first electrode of the second capacitance Cs2 is supplied with an electric potential higher than that supplied to the second electrode of the second capacitance Cs2. The first electrode of the second capacitance Cs2 is the anode power supply line IPL, for example. The second electrode of the second capacitance Cs2 is the anode electrode AD of the drive transistor DRT and an anode coupling electrode coupled to the anode electrode AD, for example.

In the display device DSP, the peripheral circuits GC (illustrated in FIG. 1) select a plurality of pixel rows in order from the first row (e.g., the uppermost pixel row in the display region DA in FIG. 1). The drive IC writes the video signals Vsig (video writing potential) to the pixels Px of the selected pixel row, thereby causing the light emitting elements LED to emit light. The drive IC supplies the video signals Vsig to the video signal line SL, supplies the reset power supply potential Vrst to the reset power supply line RL, and supplies the initialization potential Vini to the initialization power supply line INL in each horizontal scanning period. The display device DSP repeats these operations in units of an image of one frame.

The configuration of the pixel circuit PICA illustrated in FIG. 3 may be appropriately modified. The number of wires and the number of transistors in one pixel Px may be different from those illustrated in FIG. 3, for example. The pixel circuit PICA may be a current mirror circuit, for example.

Figure 4:
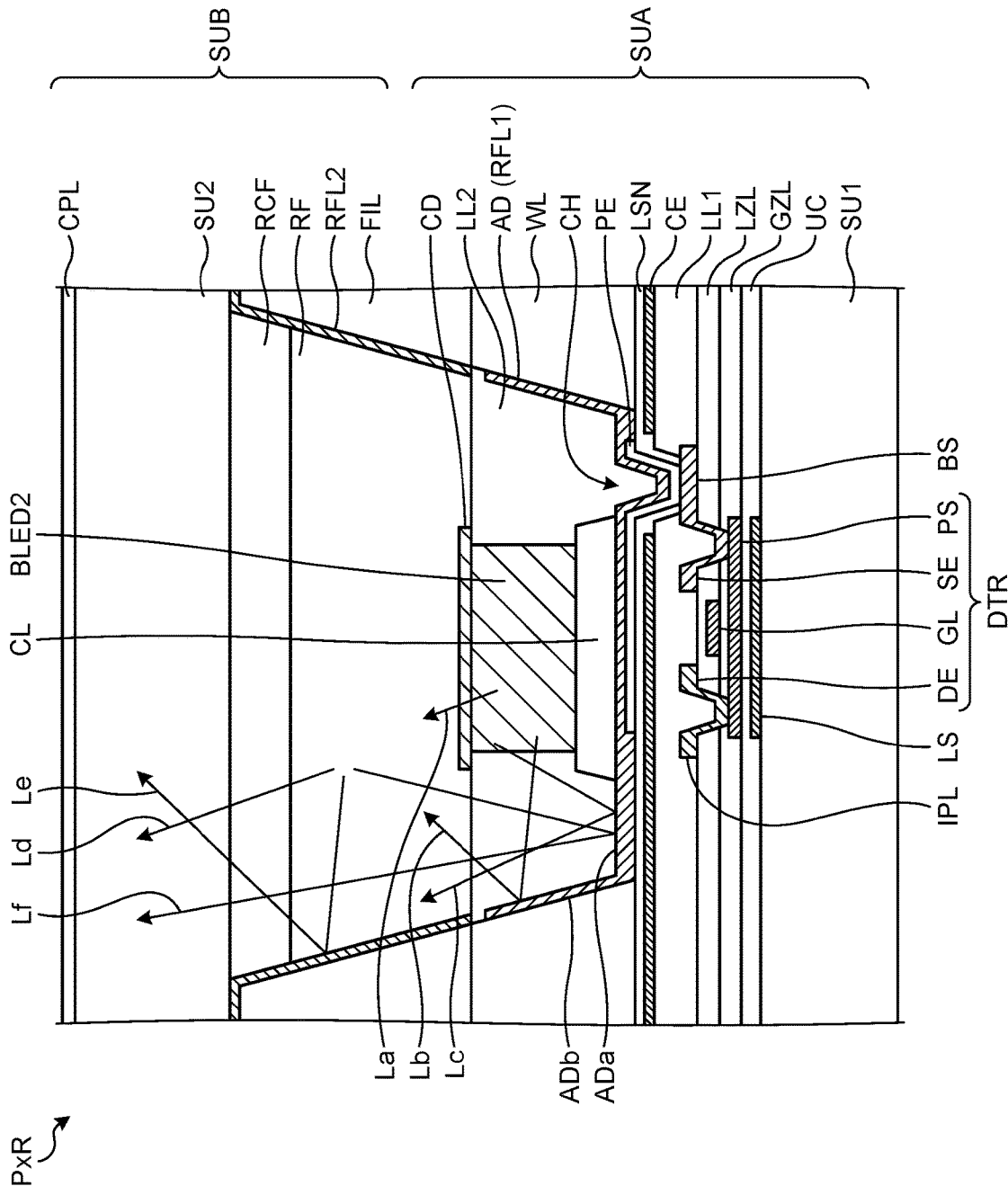
FIG. 4 is a sectional view along line IV-IV' of FIG. 2.
Figure 5:
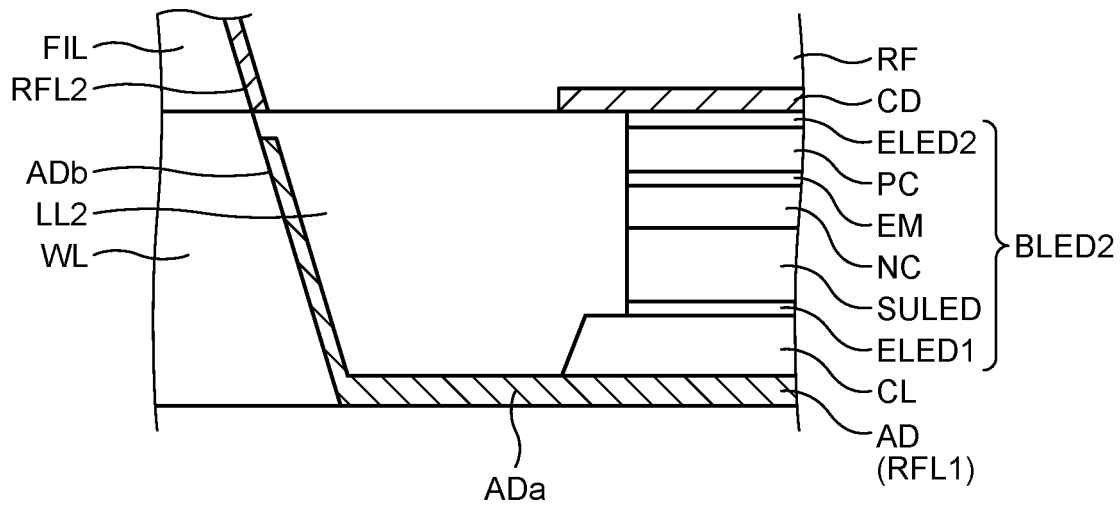
FIG. 5 is an enlarged sectional view of a light emitting element illustrated in FIG. 4.
Figure 6:
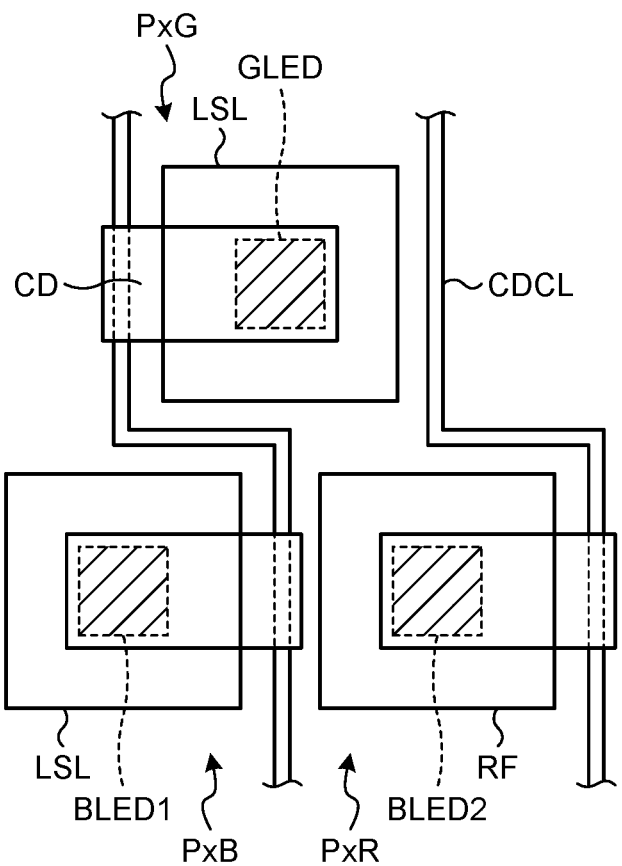
FIG. 6 is a plan view for explaining coupling between cathode electrodes and cathode coupling lines.

The following describes a specific configuration example of the light emitting element LED, the phosphor layer RF, and reflective layers (a first reflective layer RFL1 and a second reflective layer RFL2) with reference to FIGS. 4 to 6. FIG. 4 is a sectional view along line IV-IV' of FIG. 2. FIG. 4 illustrates a sectional structure of the first pixel PxR.

As illustrated in FIG. 4, the display device DSP includes the array substrate SUA and a counter substrate SUB. The array substrate SUA includes various layers on a first surface of the first substrate SU1 in order of a light-shielding layer LS, an undercoat layer UC, a semiconductor layer PS, a gate insulating film GZL, scanning wiring GL, an interlayer insulating film LZL, the anode power supply line IPL and a base BS, a first flattening layer LL1, a common electrode CE, a capacitance nitride film LSN, a pixel electrode PE, the anode electrode AD and a wall structure WL, a coupling layer CL, the second blue light emitting element BLED2 and a second flattening layer LL2, and a cathode electrode CD. The first surface of the first substrate SU1 faces the second substrate SU2.

The counter substrate SUB includes various layers on a first surface of the second substrate SU2 in order of a red color filter RCF, the phosphor layer RF, and the second reflective layer RFL2 and a filling layer FIL. The first surface of the second substrate SU2 faces the first substrate SU1. A circularly polarizing plate CPL is provided on a second surface of the second substrate SU2. The array substrate SUA and the counter substrate SUB face each other and are bonded with the phosphor layer RF covering the upper surface of the second blue light emitting element BLED2. The filling layer FIL is formed to fill the gap between the wall structure WL and the second reflective layer RFL2 when the array substrate SUA and the counter substrate SUB are joined.

In the present specification, a direction from the first substrate SU1 to the second substrate SU2 in a direction perpendicular to the surface of the first substrate SU1 is defined as an "upper side". A direction from the second substrate SU2 to the first substrate SU1 is defined as a "lower side".

The second blue light emitting element BLED2 is provided on the first substrate SU1. The first substrate SU1 is an insulating substrate and is a glass substrate, a resin substrate, or a resin film, for example. The first substrate SU1 is made of borosilicate glass having a thickness of 100 µm, for example.

The drive transistor DTR is provided on a first surface of the first substrate SU1. FIG. 4 illustrates the drive transistor DTR out of the transistors of the pixel circuit PICA. The output transistor BCT, the initialization transistor IST, the pixel selection transistor SST, and the reset transistor RST are also provided on the first surface of the first substrate SU1. Explanation of the multilayered structure of the output transistor BCT, the initialization transistor IST, the pixel selection transistor SST, and the reset transistor RST is omitted herein because they have a configuration similar to that of the drive transistor DTR.

The light-shielding layer LS is a molybdenum tungsten (MoW) alloy film having a layer thickness of approximately 50 nm. The light-shielding layer LS is made of material having lower light transmittance than that of the first substrate SU1 and provided under the semiconductor layer PS. The undercoat layer UC is a multilayered body composed of a silicon nitride (SiN) layer and a silicon oxide ($SiO_2$) layer. The layer thickness of the silicon nitride layer is approximately 100 nm, and that of the silicon oxide layer is approximately 150 nm. The semiconductor layer PS is made of polycrystalline silicon, for example, and is produced by polycrystallizing an amorphous silicon layer by laser annealing. The layer thickness of the semiconductor layer PS is approximately 50 nm, for example.

The gate insulating film GZL is a silicon oxide film having a layer thickness of approximately 100 nm. The scanning wiring GL is a molybdenum tungsten alloy film having a layer thickness of approximately 300 nm. The scanning wiring GL is wiring with which the drain line of the pixel selection transistor SST and the drain line of the initialization transistor IST merge. The gate insulating film GZL is provided between the semiconductor layer PS and the scanning wiring GL in the normal direction of the first substrate SU1. The interlayer insulating film LZL is a multilayered body composed of a silicon oxide layer and a silicon nitride layer. The layer thickness of the silicon oxide layer is approximately 350 nm, and that of the silicon nitride layer is approximately 375 nm.

The anode power supply line IPL and the base BS are provided in the same layer and are three-layer films composed of titanium (Ti), aluminum (Al), and titanium (Ti). The layer thicknesses of the respective layers are approximately 100 nm, 400 nm, and 200 nm. The part of the anode power supply line IPL overlapping the semiconductor layer PS functions as a drain electrode DE of the drive transistor DTR. The part of the base BS overlapping the semiconductor layer PS functions as a source electrode SE of the drive transistor DTR. The drain electrode DE and the source electrode SE are each coupled to the semiconductor layer PS through a contact hole formed in the interlayer insulating film LZL and the gate insulating film GZL.

The first flattening layer LL1 and the second flattening layer LL2 are organic insulating films. The layer thickness of the first flattening layer LL1 is approximately 2 µm, and the layer thickness of the second flattening layer LL2 is approximately 10 µm. The common electrode CE, the pixel electrode PE, and the cathode electrode CD are made of indium tin oxide (ITO). The layer thickness of the common electrode CE is approximately 50 nm, that of the pixel electrode PE is approximately 50 nm, and that of the cathode electrode CD is approximately 100 nm. The capacitance nitride film LSN is a silicon nitride layer produced by low-temperature deposition and has a layer thickness of approximately 120 nm. The capacitance nitride film LSN is provided between the common electrode CE and the pixel electrode PE in the normal direction of the first substrate SU1.

The wall structure WL faces the side surfaces of the light emitting element LED. The wall structure WL is provided on the capacitance nitride film LSN in a manner surrounding the light emitting element LED. The pixel electrode PE, the anode electrode AD, the coupling layer CL, the light emitting element LED, and the second flattening layer LL2 are provided in the recess formed by the wall structure WL and the capacitance nitride film LSN. Examples of the material of the wall structure WL include, but are not limited to, a positive photoresist composed of novolac resin and naphthoquinone serving as photosensitive material, a negative resist composed of acrylic resin, etc. Alternatively, the wall structure WL may be formed by forming a negative resist and then covering the side surfaces of the negative resist with a positive photoresist.

The anode electrode AD is a multilayered body composed of ITO, silver (Ag), and ITO. The anode electrode AD is provided on the pixel electrode PE and coupled to the base BS through the contact hole CH formed in the first flattening layer LL1. The anode electrode AD includes an anode electrode bottom part ADa and an anode electrode inclining part ADb. The anode electrode bottom part ADa is provided on the capacitance nitride film LSN over a region overlapping the second blue light emitting element BLED2 and a region not overlapping the second blue light emitting element BLED2. The anode electrode inclining part ADb is coupled to the end of the anode electrode bottom part ADa and provided inclining along the inner wall surface of the wall structure WL. The anode electrode inclining part ADb faces the side surfaces of the second blue light emitting element BLED2 with the second flattening layer LL2 interposed therebetween. The anode electrode AD is made of metal material that reflects light and also functions as the first reflective layer RFL1 that reflects light output from the second blue light emitting element BLED2.

The coupling layer CL is made of silver paste and provided on the anode electrode AD between the first substrate SU1 and the light emitting element LED. The second blue light emitting element BLED2 is provided on and electrically coupled to the coupling layer CL. In other words, the second blue light emitting element BLED2 is electrically coupled to the anode electrode AD via the coupling layer CL.

The second flattening layer LL2 covers the side surfaces of the second blue light emitting element BLED2 and is provided in the recess formed by the wall structure WL and the anode electrode AD. In other words, the second flattening layer LL2 covers the side surfaces of the second blue light emitting element BLED2 and is provided between the second blue light emitting element BLED2 and the anode electrode AD (first reflective layer RFL1). The position of the upper surface of the second flattening layer LL2 is the same as that of the upper surface of the wall structure WL.

Similarly to the first substrate SU1, the second substrate SU2 in the counter substrate SUB is made of borosilicate glass having a thickness of 100 μm, for example.

The red color filter RCF is provided on the phosphor layer RF, that is, between the phosphor layer RF and the counter substrate SUB in the normal direction of the first substrate SU1. The red color filter RCF is formed by patterning a negative resist containing a red pigment. The layer thickness of the red color filter RCF is approximately 2 μm, for example. The red color filter RCF absorbs light having a blue wavelength component output from the second blue light emitting element BLED2, thereby increasing the color purity of light output to the second substrate SU2. In addition, the red color filter RCF can prevent the phosphor layer RF from emitting light by external light because it absorbs green and blue light.

The phosphor layer RF is provided overlapping the red color filter RCF. The side surfaces of the phosphor layer RF and the red color filter RCF incline with respect to the normal direction (third direction Dz) of the substrate. The area of the lower surface of the phosphor layer RF is smaller than that of the upper surface of the red color filter RCF. The phosphor layer RF is formed by patterning a negative resist containing quantum dots that emit red light. The layer thickness of the phosphor layer RF is approximately 30 μm, for example.

The quantum dot is composed of a cadmium selenide (CdSe) core structure and a zinc sulfide (ZnS) shell structure surrounding the CdSe core structure. The particle size of the quantum dot is adjusted to have the fluorescent maximum wavelength at a wavelength of 630 nm. The quantum dot has a continuous absorption spectrum and performs sufficient absorption at the maximum emission wavelength of the second blue light emitting element BLED2. The shell structure has an organic molecular chain to increase the compatibility with the negative resist on the surface. The present embodiment is not limited thereto, and a non-cadmium-based quantum dot may be used. Examples of the non-cadmium-based quantum dot include, but are not limited to, a quantum dot composed of an indium phosphide (InP) core structure and a zinc sulfide (ZnS) shell structure, etc.

The second reflective layer RFL2 is made of metal material, such as aluminum (Al). The layer thickness of the second reflective layer RFL2 is approximately 100 nm, for example. The second reflective layer RFL2 is provided over the side surfaces of the phosphor layer RF and the red color filter RCF.

The filling layer FIL is an organic insulating film and is provided around the second reflective layer RFL2, the phosphor layer RF, and the red color filter RCF.

The array substrate SUA and the counter substrate SUB are bonded such that the phosphor layer RF overlaps the second flattening layer LL2 and that the filling layer FIL overlaps the wall structure WL. As a result, the phosphor layer RF is provided covering the upper surface of the second blue light emitting element BLED2 and the second flattening layer LL2.

The second reflective layer RFL2 is provided on the side surfaces of the phosphor layer RF and disposed farther away from the first substrate SU1 than the first reflective layer RFL1 (anode electrode AD) in the normal direction of the first substrate SU1. The anode electrode inclining part ADb and the second reflective layer RFL2 incline with respect to the normal direction of the first substrate SU1. The second flattening layer LL2 serving as an insulating layer is provided between the lower end of the second reflective layer RFL2 and the upper end of the anode electrode inclining part ADb. The opening part at the lower end of the second reflective layer RFL2 overlaps the opening part at the upper end of the anode electrode AD in planar view. In the sectional shape, the second reflective layer RFL2 is disposed on a line with the anode electrode inclining part ADb of the anode electrode AD. The present embodiment is not limited thereto, and the second reflective layer RFL2 may be deviated from the anode electrode inclining part ADb of the anode electrode AD. The opening part at the lower end of the second reflective layer RFL2 may have a larger area than the opening part at the upper end of the anode electrode AD, for example.

The material and the layer thickness of the layers are given by way of example only and may be appropriately modified. The semiconductor layer PS, for example, is not necessarily made of polycrystalline silicon and may be made of amorphous silicon, microcrystalline oxide semiconductor, amorphous oxide semiconductor, low-temperature polycrystalline silicon (LTPS), or gallium nitride (GaN). Examples of the oxide semiconductor include, but are not limited to, IGZO, zinc oxide (ZnO), ITZO, etc. IGZO is indium gallium zinc oxide, and ITZO is indium tin zinc oxide. In the example illustrated in FIG. 4, the drive transistor DTR has what is called a top-gate structure. The drive transistor DTR may have a bottom-gate structure in which the gate electrode is provided under the semiconductor layer PS. Alternatively, the drive transistor DTR may have a dual-gate structure in which the gate electrodes are provided both on and under the semiconductor layer PS.

The following describes the configuration of the light emitting element LED. FIG. is an enlarged sectional view of the light emitting element illustrated in FIG. 4. While FIG. 5 illustrates a sectional structure of the second blue light emitting element BLED2, the first blue light emitting element BLED1 and the green light emitting element GLED also have the same multilayered structure. As illustrated in FIG. 5, the second blue light emitting element BLED2 includes a light emitting element substrate SULED, an n-type cladding layer NC, a light emitting layer EM, a p-type cladding layer PC, the anode terminal ELED1, and the cathode terminal ELED2. The n-type cladding layer NC, the light emitting layer EM, the p-type cladding layer PC, and the cathode terminal ELED2 are stacked in order on the light emitting element substrate SULED. The anode terminal ELED1 is provided between the light emitting element substrate SULED and the coupling layer CL.

In the first blue light emitting element BLED1 and the second blue light emitting element BLED2 that output blue light, the light emitting layer EM is made of indium gallium nitride (InGaN). The composition ratio of indium to gallium is 0.2:0.8, for example. The p-type cladding layer PC and the n-type cladding layer NC are made of gallium nitride (GaN). The light emitting element substrate SULED is made of silicon carbide (SiC).

In the green light emitting element GLED that outputs green light, the light emitting layer EM is made of indium gallium nitride (InGaN). The composition ratio of indium to gallium is 0.45:0.55, for example. The p-type cladding layer PC and the n-type cladding layer NC are made of gallium nitride (GaN). The light emitting element substrate SULED is made of silicon carbide (SiC).

Both the anode terminal ELED1 and the cathode terminal ELED2 of the first blue light emitting element BLED1, the second blue light emitting element BLED2, and the green light emitting element GLED are made of aluminum.

The maximum emission wavelength of the green light emitting element GLED is 530 nm. The maximum emission wavelength of the first blue light emitting element BLED1 and the second blue light emitting element BLED2 is 450 nm.

In the manufacturing process for each light emitting element LED, a manufacturing apparatus forms the n-type cladding layer NC, the light emitting layer EM, the p-type cladding layer PC, and the cathode terminal ELED2 on the light emitting element substrate SULED. Subsequently, the manufacturing apparatus reduces the thickness of the light emitting element substrate SULED and forms the anode terminal ELED1 on the bottom surface of the light emitting element substrate SULED. The manufacturing apparatus then disposed the light emitting element LED cut into a rectangular shape on the coupling layer CL.

The coupling layer CL made of silver paste adheres and is electrically coupled to the light emitting element LED while being deformed depending on force when the light emitting element LED is disposed. Alternatively, the coupling layer CL may be made of the same metal material, such as aluminum, as that of the anode terminal ELED1. In this case, the manufacturing apparatus disposes the light emitting element LED on the coupling layer CL and then performs heating, thereby integrating the anode terminal ELED1 and the coupling layer CL. As a result, the coupling layer CL is favorably electrically coupled to the light emitting element LED. The cathode electrode CD is provided on the upper surface of the light emitting element LED and between the light emitting element LED and the phosphor RF.

FIG. 6 is a plan view for explaining coupling between the cathode electrodes and cathode coupling lines. The cathode electrodes CD are provided to the respective light emitting elements LED (the first blue light emitting element BLED1, the second blue light emitting element BLED2, and the green light emitting element GLED). The cathode electrode CD is electrically coupled to a cathode coupling line CDCL. The cathode electrode CD is electrically coupled to the cathode electrodes CD provided to other light emitting elements LED via the cathode coupling line CDCL. With this configuration, a plurality of light emitting elements LED are supplied with the common cathode power supply potential PVSS.

The cathode coupling line CDCL is provided in the same layer as that of the anode electrode AD, that is, on the capacitance nitride film LSN. The cathode coupling line CDCL may be provided in a layer different from that of the anode electrode AD.

The following describes an optical path and wavelength conversion of light output from the second blue light emitting element BLED2 with reference to FIGS. 4 and 7 to 9.

FIG. 4 illustrates light La output upward and light Lb and Lc output sideward in the light output from the second blue light emitting element BLED2. The light La is output from the upper surface of the second blue light emitting element BLED2, passes through the cathode electrode CD, and is incident on the phosphor layer RF. The light Lb is output from the side surface of the second blue light emitting element BLED2, passes through the second flattening layer LL2, and is incident on the anode electrode inclining part ADb. The light Lb reflected by the anode electrode inclining part ADb is incident on the phosphor layer RF because the anode electrode inclining part ADb inclines. The light Lc is output toward the lower side (toward the first substrate SU1) than the light Lb. The light Lc passes through the second flattening layer LL2 and is incident on the anode electrode bottom part ADa. The light Lc reflected by the anode electrode bottom part ADa is incident on the phosphor layer RF.

As described above, the anode electrode AD (first reflective layer RFL1) causes the light Lb and Lc output sideward from the second blue light emitting element BLED2 to be incident on the phosphor layer RF. The light La is incident on the phosphor layer RF without being reflected by the anode electrode AD. The light La, Lb, and Lc incident on the gap between the anode electrode inclining part ADb and the second reflective layer RFL2 becomes leaking light. The amount of leaking light accounts for a slight part of the whole amount of light, and most of the light La, Lb, and Lc is incident on the phosphor layer RF.

The phosphor layer RF receives the light La, Lb, and Lc, thereby emitting red light. The phosphor layer RF isotropically emits light. FIG. 4 illustrates fluorescence Ld, Le, and Lf in the light generated in the phosphor layer RF. The fluorescence Ld emitted upward is not incident on the second reflective layer RFL2 and is output to the second substrate SU2 through the color filter RCF. The fluorescence Le emitted sideward is incident on the second reflective layer RFL2. The fluorescence Le reflected by the second reflective layer RFL2 is output to the second substrate SU2 through the color filter RCF because the second reflective layer RFL2 inclines. The fluorescence Lf emitted downward is incident on the anode electrode AD. The fluorescence Lf reflected by the anode electrode AD is output to the second substrate SU2 through the phosphor layer RF again.

As described above, the second reflective layer RFL2 is provided facing the side surfaces of the phosphor layer RF, and the anode electrode AD is provided under the phosphor layer RF. The second reflective layer RFL2 extends to the upper side than the upper surface of the phosphor layer RF, and the anode electrode AD extends to the lower side than the lower surface of the phosphor layer RF. This configuration can increase the number of times of reflection of the light La, Lb, and Lc and the fluorescence Ld, Le, and Lf compared with the case where a reflective layer is provided only to the side surfaces of the phosphor layer RF. The fluorescence Ld, Le, and Lf is reflected a plurality of times on the anode electrode AD and the second reflective layer RFL2, thereby changing its traveling direction. In other words, the traveling direction of the fluorescence Ld, Le, and Lf isotropically emitted in the phosphor layer RF is converted to a direction closer to the normal direction of the first substrate SU1 by the anode electrode AD and the second reflective layer RFL2. The fluorescence Ld, Le, and Lf is then output to the second substrate SU2. Consequently, the display device DSP has higher light extraction efficiency.

Figure 7:
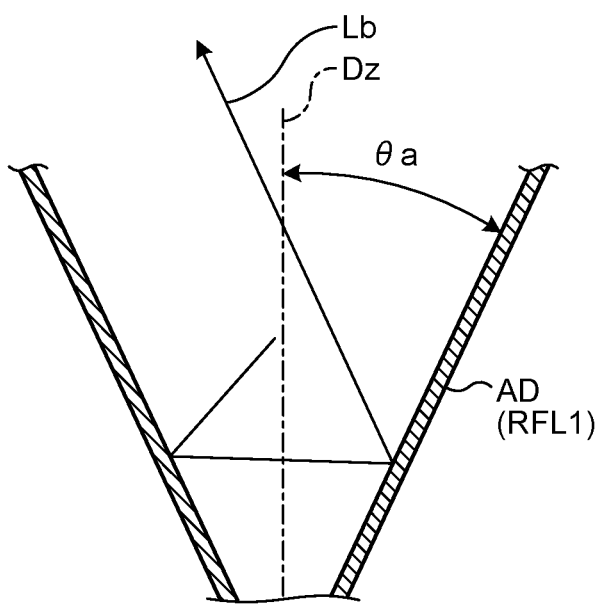
FIG. 7 is a view for explaining a traveling direction of light reflected by an anode electrode.
Figure 8:
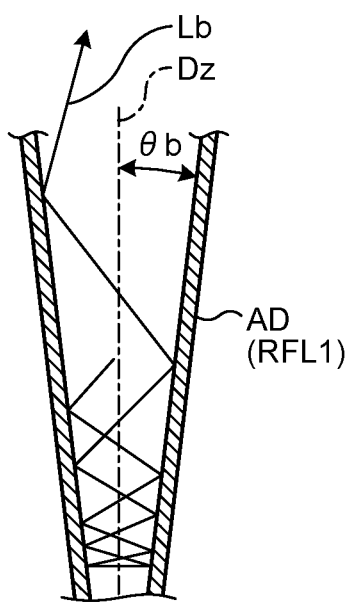
FIG. 8 is a view for explaining another example of a traveling direction of light reflected by the anode electrode.
Figure 9:
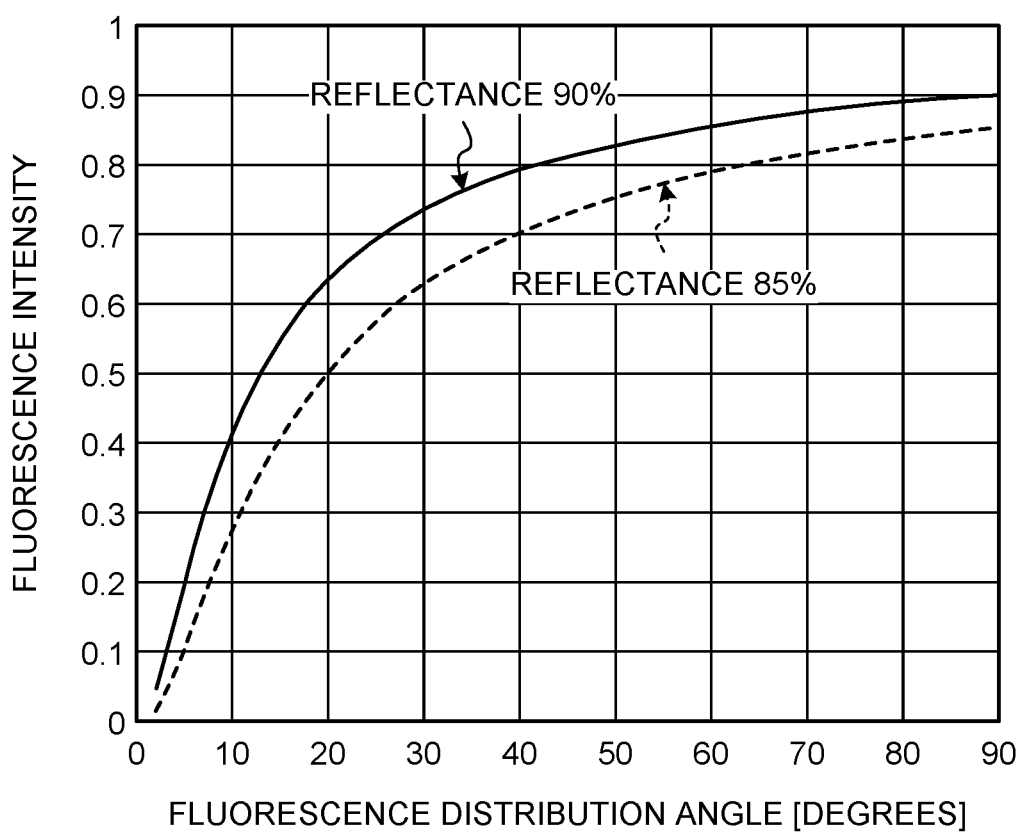
FIG. 9 is a graph of the relation between fluorescence distribution angle and fluorescence intensity.

FIG. 7 is a view for explaining a traveling direction of light reflected by the anode electrode. FIG. 8 is a view for explaining another example of a traveling direction of light reflected by the anode electrode. FIG. 9 is a graph of the relation between fluorescence distribution angle and fluorescence intensity. While FIGS. 7 and 8 illustrate reflection on the anode electrode AD, explanation with reference to FIGS. 7 and 8 is also applicable to the second reflective layer RFL2.

The angle formed by the anode electrode AD and the third direction Dz is θa in FIG. 7, and the angle formed by the anode electrode AD and the third direction Dz is θb in FIG. 8. The angle θb is smaller than the angle θa. In FIG. 7, the traveling direction of the light Lb ranges within an angle of 2θa, that is, ±θa about the third reaction Dz. Similarly, in FIG. 8, the traveling direction of the light Lb ranges within an angle of 2θb.

As illustrated in FIG. 7, if the light Lb is output toward lower left, the light Lb is reflected twice by the anode electrode AD. As a result, the traveling direction of the light Lb is changed to upward, and the light Lb is output toward the phosphor layer RF (refer to FIG. 4). In FIG. 8, the light Lb is reflected eleven times by the anode electrode AD. As a result, the traveling direction of the light Lb is changed to upward, and the light Lb is output toward the phosphor layer RF (refer to FIG. 4).

When the angle formed by the anode electrode AD and the third direction Dz is θ, the traveling direction of the light Lb comes closer to the third direction Dz by 2θ every time the light Lb is reflected by the anode electrode AD. In other words, the light Lb traveling within a range from 0° to θ with respect to the third direction Dz is output toward the phosphor layer RF without being reflected at all. The light Lb traveling within an angular range from θ to an angle smaller than 3θ with respect to the third direction Dz is output toward the phosphor layer RF by being reflected once. The light Lb traveling within an angular range from 3θ to an angle smaller than 5θ with respect to the third direction Dz is output toward the phosphor layer RF by being reflected twice. Similarly, light traveling at an angle of 5θ or larger is output toward the phosphor layer RF by being reflected a larger number of times.

Similarly to this, the fluorescence Ld, Le, and Lf emitted in the phosphor layer RF is output toward the second substrate SU2 by being reflected by the second reflective layer RFL2 a plurality of number of times.

The light La, Lb, and Lc and the fluorescence Ld, Le, and Lf attenuate every time they are reflected by the anode electrode AD and the second reflective layer RFL2. FIG. 9 illustrates the relation between fluorescence intensity and fluorescence distribution angle after light is multiply reflected by the anode electrode AD and the second reflective layer RFL2 in a case where the anode electrode AD and the second reflective layer RFL2 are sufficiently long. The fluorescence distribution angle corresponds to the angle 2θ described above.

When the reflectance of the anode electrode AD and the second reflective layer RFL2 is 100%, the fluorescence intensity is 1. If the anode electrode AD and the second reflective layer RFL2 are made of aluminum, the reflectance is 85%. If the anode electrode AD and the second reflective layer RFL2 are made of silver, the reflectance is 90%.

The total reflection angle on the air interface is $\theta_{TR}$. When the angle θ formed by the anode electrode AD and the second reflective layer RFL2 with respect to the third direction Dz is $\theta_{TR}$ or larger, all the light is output upward. When the refractive index of the light emitting element LED on the air interface is $n_{LED}$, the total reflection angle $\theta_{TR}$ is expressed by Expression (1):

$$\theta_{TR} = \arcsin(1/n_{LED}) \tag{1}$$

When $n_{LED}$ is 2.4, $\theta_{TR}$ is calculated to be 25° based on Expression (1). For this reason, the present embodiment determined the angle θ formed by the anode electrode AD and the second reflective layer RFL2 with respect to the third direction Dz to be 25°. In other words, the fluorescence distribution angle 2θ is 50°. In this case, the number of times of light being reflected by the anode electrode AD and the second reflective layer RFL2 is zero to three times, thereby preventing reduction in fluorescence intensity. As illustrated in FIG. 9, when the reflectance of the anode electrode AD and the second reflective layer RFL2 is 85% and 90%, the fluorescence intensity is 75% and 83%, respectively.

By making the angle θ smaller than the total reflection angle $\theta_{TR}$, the traveling direction of light output from the phosphor layer RF comes closer to the third direction Dz. In other words, the display device DSP has higher light intensity in the normal direction of the first substrate SU1.

Figure 10:
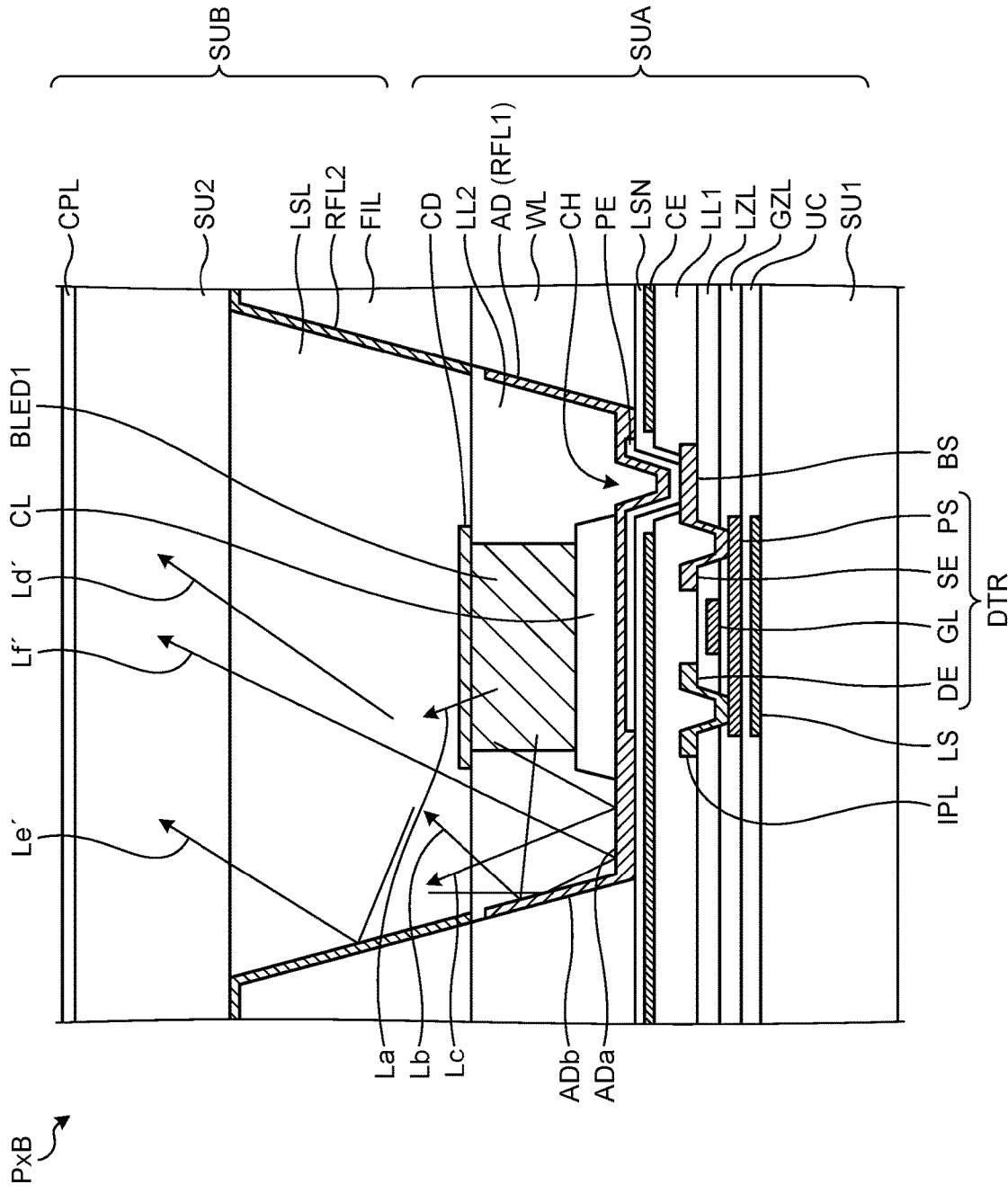
FIG. 10 is a sectional view along line X-X' of FIG. 2.

FIG. 10 is a sectional view along line X-X' of FIG. 2. FIG. 10 illustrates a sectional structure of the third pixel PxB. While FIG. 10 illustrates a sectional structure of the third pixel PxB, explanation with reference to FIG. 10 is also applicable to the second pixel PxG. As illustrated in FIG. 10, the third pixel PxB is different from the first pixel PxR illustrated in FIG. 4 in that the light scattering layer LSL is provided on the first blue light emitting element BLED1 and the second flattening layer LL2. The light scattering layer LSL is provided on the first surface of the second substrate SU2, and the second reflective layer RFL2 is provided on the side surfaces of the light scattering layer LSL. In other words, the third pixel PxB does not include the color filter layer CF or the phosphor layer RF illustrated in FIG. 4.

The light scattering layer LSL is formed by patterning a negative resist containing high-refractive-index minute particles. In the third pixel PxB, the light Lb and Lc output from the first blue light emitting element BLED1 passes through the second flattening layer LL2, is reflected by the anode electrode AD, and is incident on the light scattering layer LSL. Light Ld', Le', and Lf scattered by the light scattering layer LSL is reflected by the anode electrode AD and the second reflective layer RFL2 a plurality of times and output toward the second substrate SU2. Alternatively, part of the scattered light Ld', Le', and Lf is not reflected by the anode electrode AD or the second reflective layer RFL2 and is output toward the second substrate SU2.

The angle θ of the anode electrode AD and the second reflective layer RFL2 of the third pixel PxB can be equal to the angle θ of the anode electrode AD and the second reflective layer RFL2 of the first pixel PxR. As a result, the traveling direction of the light Ld', Le', and Lf scattered by the light scattering layer LSL ranges within an angle of 2θ. The light scattering layer LSL, the anode electrode AD, and the second reflective layer RFL2 can make the emission distribution angle of the third pixel PxB equivalent to that of the first pixel PxR. Consequently, the display device DSP can obtain constant hue independently of the visual angle.

First Modification of the First Embodiment

Figure 11:
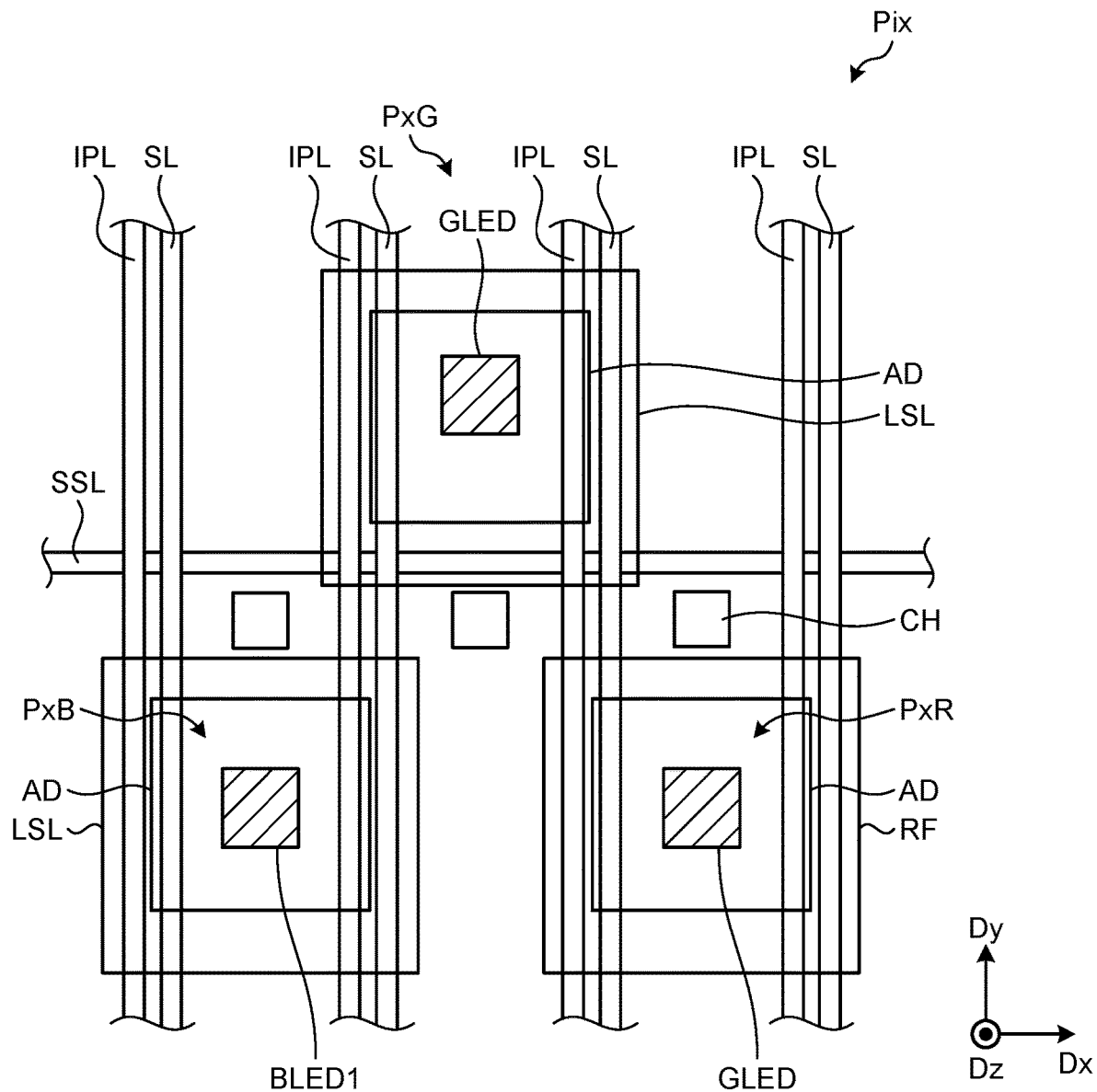
FIG. 11 is a plan view of a plurality of pixels of the display device according to a first modification of the first embodiment.

FIG. 11 is a plan view of a plurality of pixels of the display device according to a first modification of the first embodiment. In the following description, the components described in the embodiment above are denoted by like reference numerals, and explanation thereof is omitted.

As illustrated in FIG. 11, the light emitting element of the first pixel PxR according to the first modification is the green light emitting element GLED. In this case, the phosphor layer RF is made of 4-(Dicyanomethylene)-2-methyl-6-(4-dimethylaminostyryl)-4H-pyran (DCM) that is organic low-molecular material. The absorption spectrum of DCM has the maximum near the wavelength corresponding to green. Consequently, the phosphor layer RF can absorb light output from the green light emitting element GLED and emit red light. Instead of DCM, the organic low-molecular material used for the phosphor layer RF may be 4-(Dicyanomethylene)-2-[2-(julolidin-9-yl)vinyl]-6-methyl-4H-pyran (DCM2) or 2-tert-butyl-4-(Dicyanomethylene)-6-[2-(1,1,7,7tetramethyljulolidin-9-yl)vinyl]-4H-pyran (DCJTB). The sectional structure of the first pixel PxR is the same as that illustrated in FIG. 4. The configuration of the second pixel PxG and the third pixel PxB is the same as that illustrated in FIG. 10.

DCM that is organic low-molecular material is monomolecularly dispersed in the negative resist like the quantum dots. Consequently, the use of DCM has the advantage of not causing light scattering or reduction in efficiency and afterglow due to resorption. In addition, the use of DCM can reduce the manufacturing cost of the display device DSP because the organic low-molecular material is less expensive than the quantum dots.

Second Modification of the First Embodiment

Figure 12:
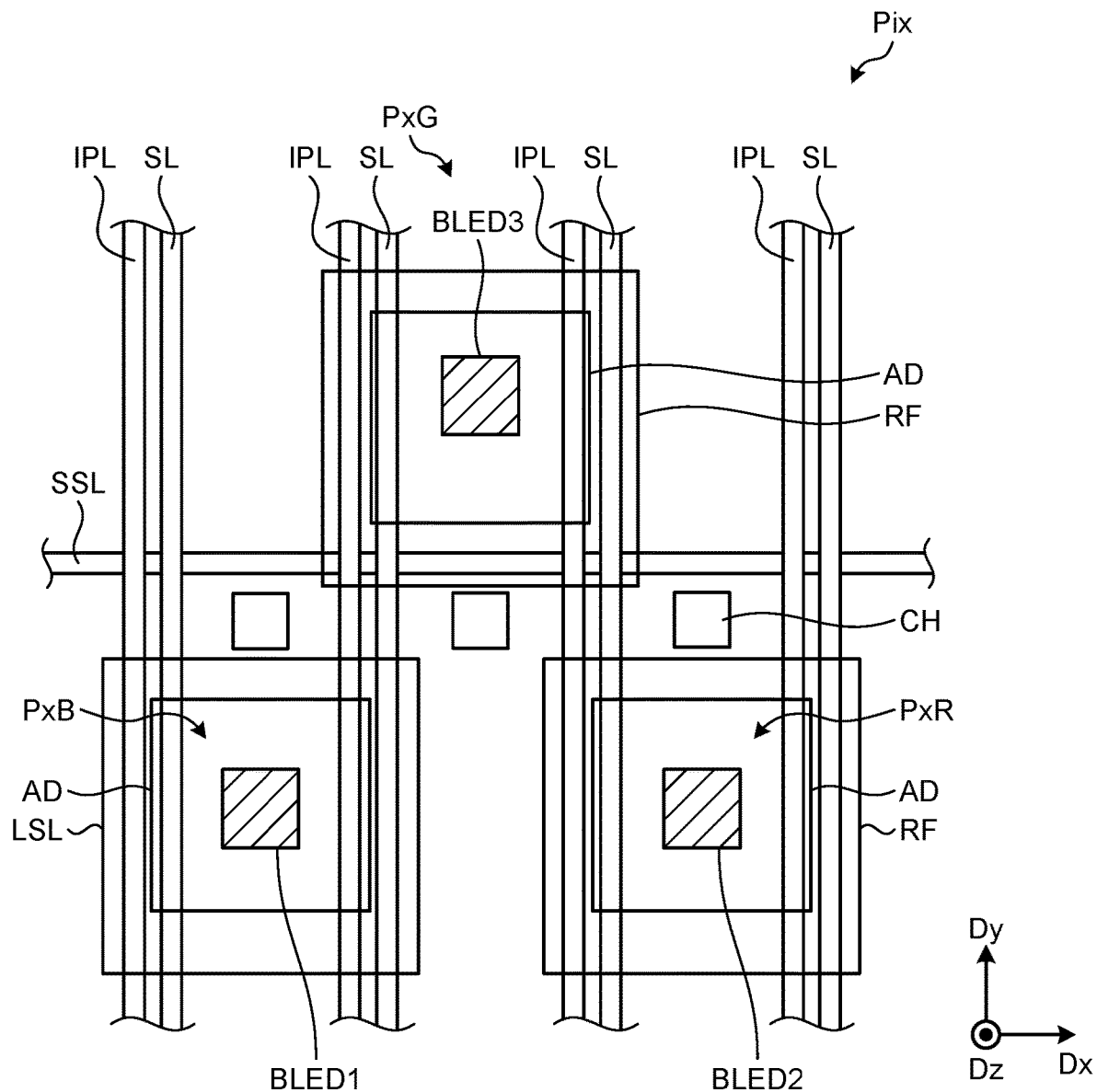
FIG. 12 is a plan view of a plurality of pixels of the display device according to a second modification of the first embodiment.

FIG. 12 is a plan view of a plurality of pixels of the display device according to a second modification of the first embodiment. As illustrated in FIG. 12, the second pixel PxG according to the second modification is provided as a combination of a third blue light emitting element BLED3, the phosphor layer RF, and a green color filter (not illustrated in FIG. 12). The third blue light emitting element BLED3 outputs blue light. The phosphor layer RF of the second pixel PxG converts light output from the third blue light emitting element BLED3 into green light. The phosphor layer RF of the second pixel PxG is made of a negative resist containing quantum dots that emit green light. The present modification is not limited thereto, and the phosphor layer RF may be made of organic metal complex, such as Alq3, instead of the quantum dots. The green color filter of the second pixel PxG is made of a negative resist containing a green pigment.

With this configuration, the second pixel PxG converts the wavelength of light output from the third blue light emitting element BLED3 and outputs green light. As illustrated in FIG. 4 and other figures, the first pixel PxR converts the wavelength of light output from the second blue light emitting element BLED2 and outputs red light.

In the second modification, the first pixel PxR, the second pixel PxG, and the third pixel PxB are all provided with the blue light emitting element BLED. In the manufacturing process for the display device DSP, the light emitting elements LED can be arrayed in a simpler manner because the same light emitting elements LED are used for the respective pixels Px.

Like the configuration illustrated in FIG. 10, the third pixel PxB is provided as a combination of the first blue light emitting element BLED1 and the light scattering layer LSL. The third pixel PxB may include a phosphor layer that emits blue light and a blue color filter on the first blue light emitting element BLED1 instead of the light scattering layer LSL. The blue phosphor layer absorbs blue light output from the first blue light emitting element BLED1 and emits blue light. The blue phosphor layer has the same advantageous effects as those of the light scattering layer LSL because the blue phosphor layer isotropically emits light. With the blue color filter, the display device DSP can prevent light scattering due to external light and reduction in the contrast ratio.

Third Modification of the First Embodiment

Figure 13:
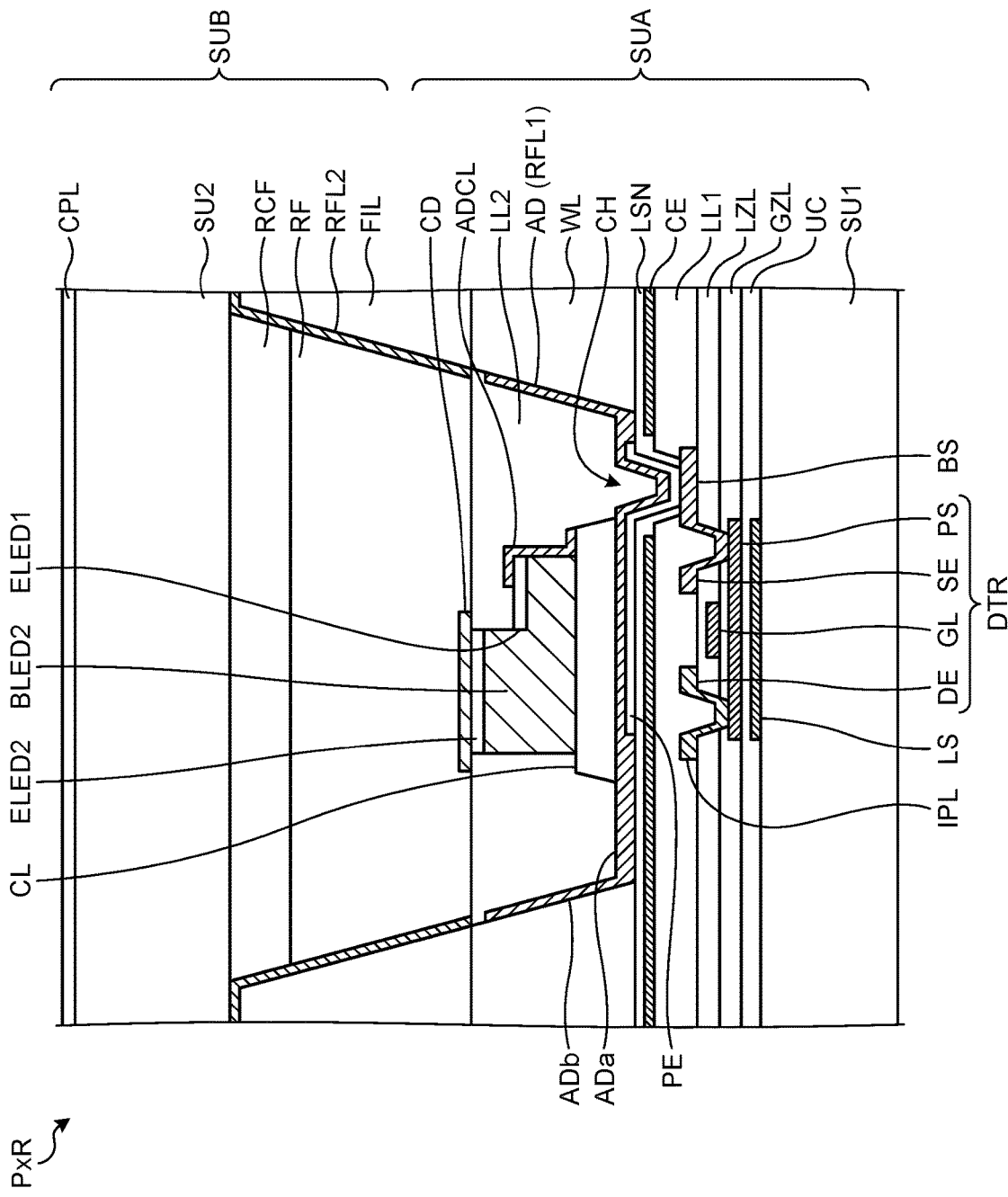
FIG. 13 is a sectional view of the display device according to a third modification of the first embodiment.

FIG. 13 is a sectional view of the display device according to a third modification of the first embodiment. While the light emitting element LED according to the first embodiment and the first and the second modifications has a vertical structure in which the light emitting element LED is coupled to the anode electrode AD at the lower part and to the cathode electrode CD at the upper part, the structure of the light emitting element LED is not limited thereto. As illustrated in FIG. 13, both the anode terminal ELED1 and the cathode terminal ELED2 according to the third modification are provided on the upper surface of the second blue light emitting element BLED2.

The cathode terminal ELED2 is electrically coupled to the cathode electrode CD. The anode terminal ELED1 is electrically coupled to the coupling layer CL via an anode coupling layer ADCL. The anode coupling layer ADCL is made of molybdenum tungsten alloy. Alternatively, the anode coupling layer ADCL may be a multilayered film composed of molybdenum tungsten alloy and aluminum.

As described above, the second blue light emitting element BLED2 may have a horizontal structure in which the anode terminal ELED1 and the cathode terminal ELED2 are disposed on the same surface. While FIG. 13 illustrates the second blue light emitting element BLED2 of the first pixel PxR, the green light emitting element GLED of the second pixel PxG and the first blue light emitting element BLED1 of the third pixel PxB may also have the same configuration.

Fourth Modification of the First Embodiment

Figure 14:
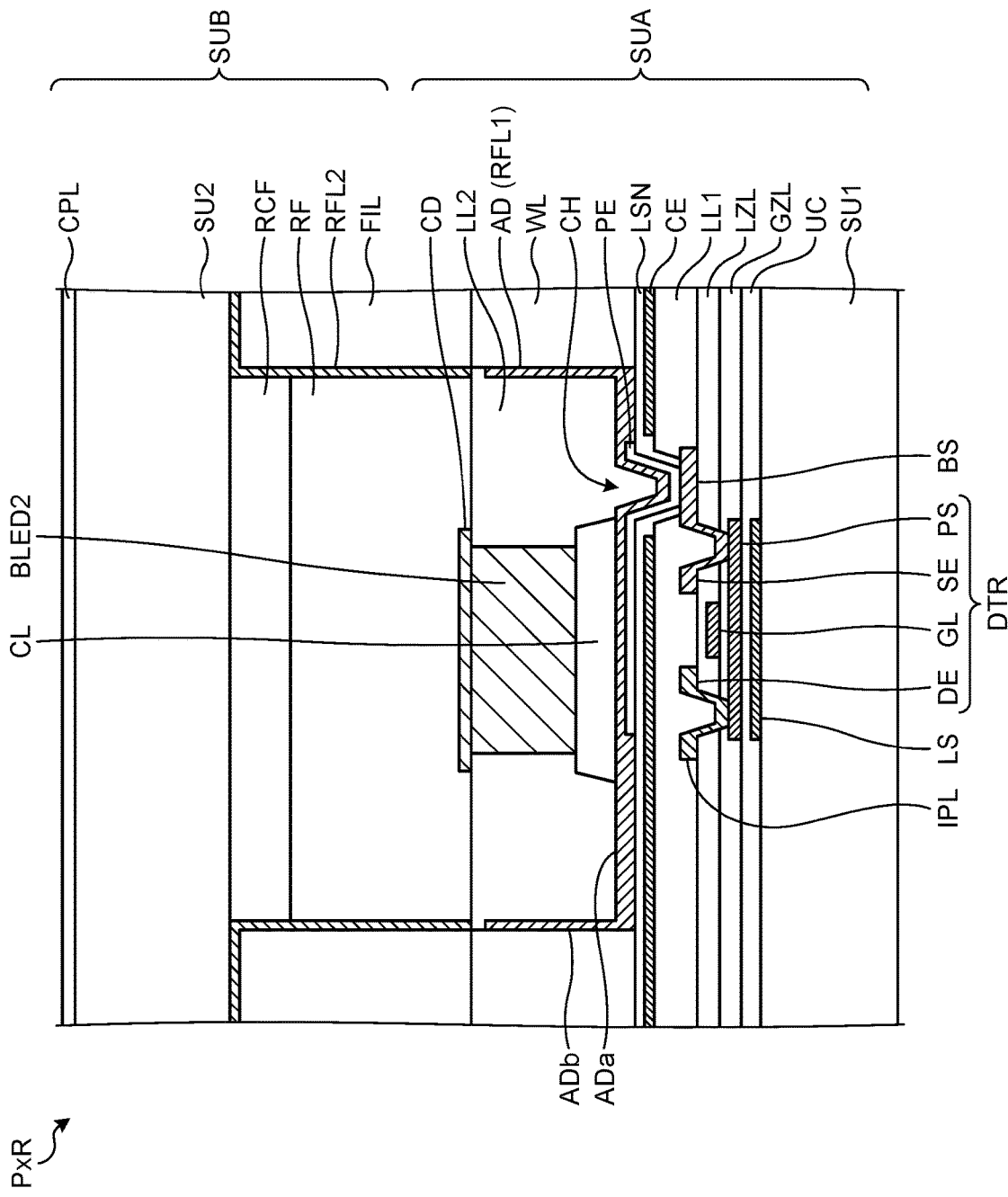
FIG. 14 is a sectional view of the display device according to a fourth modification of the first embodiment.

FIG. 14 is a sectional view of the display device according to a fourth modification of the first embodiment. As illustrated in FIG. 14, the anode electrode inclining part ADb and the second reflective layer RFL2 according to the fourth modification extend in the normal direction of the first substrate SU1. Also in this case, the light Lb and Lc (refer to FIG. 4) output sideward from the second blue light emitting element BLED2 is output to the phosphor layer RF by the anode electrode AD. The fluorescence Ld, Le, and Lf emitted in the phosphor layer RF is multiply reflected by the second reflective layer RFL2 and output toward the second substrate SU2. Consequently, the display device DSP has higher light extraction efficiency.

Second Embodiment

Figure 15:
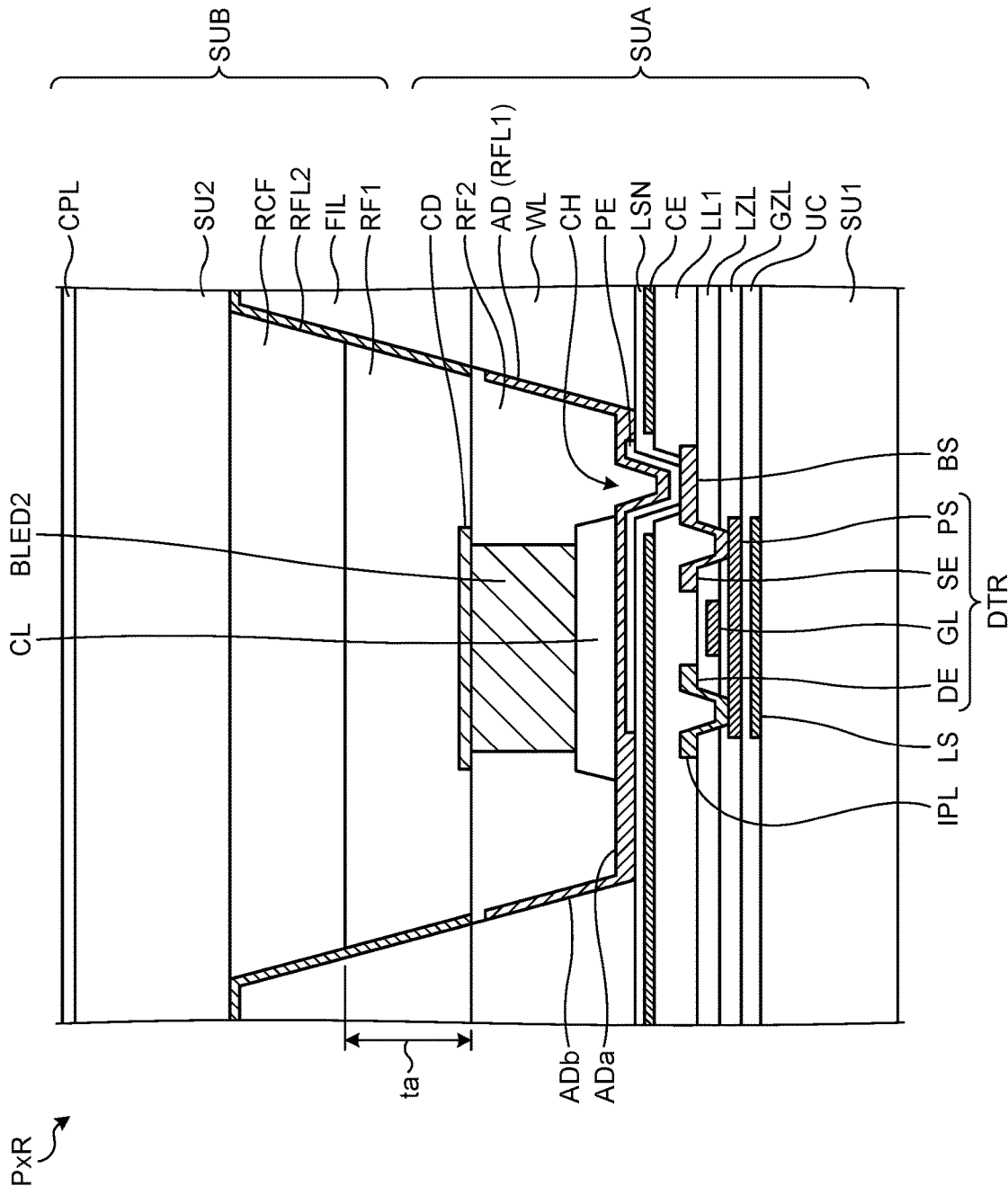
FIG. 15 is a sectional view of the display device according to a second embodiment.

FIG. 15 is a sectional view of the display device according to a second embodiment. As illustrated in FIG. 15, the second embodiment includes a second phosphor layer RF2 instead of the second flattening layer LL2 according to the first embodiment. In other words, the phosphor layer in the first pixel PxR includes a first phosphor layer RF1 and the second phosphor layer RF2. The first phosphor layer RF1 is provided to the counter substrate SUB and covers at least the upper surface of the second blue light emitting element BLED2. The second phosphor layer RF2 is provided between the first substrate SU1 and the first phosphor layer RF1 in the normal direction of the first substrate SU1 and covers the side surfaces of the second blue light emitting element BLED2. More specifically, the second phosphor layer RF2 is provided in the recess formed by the wall structure WL and the anode electrode AD.

The light Lb and Lc (refer to FIG. 4) output from the side surface of the second blue light emitting element BLED2 causes the second phosphor layer RF2 to emit light on the side of the second blue light emitting element BLED2. The light emitted in the second phosphor layer RF2 is isotropic. Light traveling toward the first substrate SU1 and light traveling parallel to the first substrate SU1 in the light emitted in the second phosphor layer RF2 are reflected by the anode electrode AD and incident on the first phosphor layer RF1.

With the second phosphor layer RF2, the second embodiment has a longer optical path of the light Lb and Lc passing through the first phosphor layer RF1 and the second phosphor layer RF2. Consequently, the present embodiment can improve the advantageous effect of absorbing light having a blue wavelength component output from the second blue light emitting element BLED2. With the second phosphor layer RF2, the second embodiment can make the thickness to of the first phosphor layer RF1 provided on the upper surface of the second blue light emitting element BLED2 thinner than the first embodiment.

In the configuration according to the first embodiment, only the second reflective layer RFL2 is provided on the side surfaces of the phosphor layer RF. By contrast, in the configuration according to the second embodiment, the anode electrode AD and the second reflective layer RFL2 are provided on the side surfaces of the first phosphor layer RF1 and the second phosphor layer RF2. In other words, the length of the reflective layer in contact with the phosphor layer (the first phosphor layer RF1 and the second phosphor layer RF2) is longer. Consequently, the display device DSP can collect light emitted in the first phosphor layer RF1 and the second phosphor layer RF2 such that the traveling direction of the light falls within the florescence distribution angle 2θ.

The present embodiment may also have the configurations according to the first to the fourth modifications.

Third Embodiment

Figure 16:
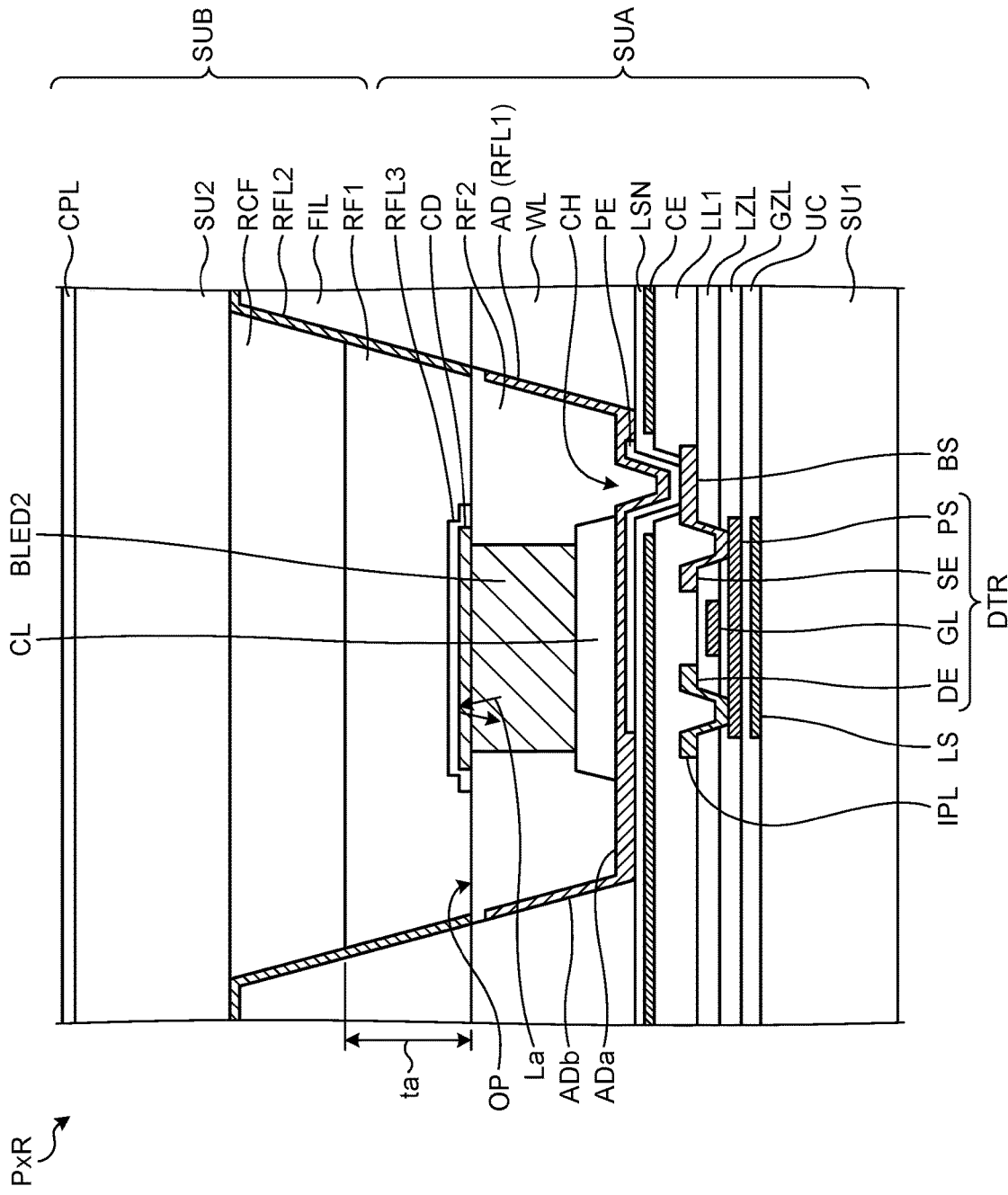
FIG. 16 is a sectional view of the display device according to a third embodiment.

FIG. 16 is a sectional view of the display device according to a third embodiment. As illustrated in FIG. 16, the first pixel PxR according to the third embodiment includes a third reflective layer RFL3 besides the anode electrode AD and the second reflective layer RFL2. The third reflective layer RFL3 is provided on the second phosphor layer RF2 and covers the cathode electrode CD. In other words, the third reflective layer RFL3 is provided between the upper surface of the second blue light emitting element BLED2 and the first phosphor layer RF1. The third reflective layer RFL3 is made of metal material, such as aluminum and silver.

The third reflective layer RFL3 is separated from the anode electrode AD and the second reflective layer RFL2, and an opening OP is formed between the upper end of the anode electrode AD and the lower end of the second reflective layer RFL2. The light La output upward from the second blue light emitting element BLED2 is reflected by the third reflective layer RFL3 and returned to the inside of the second blue light emitting element BLED2. Alternatively, the light La reflected by the third reflective layer RFL3 is partially output from the side surface of the second blue light emitting element BLED2. The light La reflected by the third reflective layer RFL3 is reflected by the anode electrode AD, passes through the opening OP, and is incident on the first phosphor layer RF1.

The third embodiment has a longer path of the light La output upward and passing through the phosphor layer (the first phosphor layer RF1 and the second phosphor layer RF2) than the first and the second embodiments. Consequently, the first phosphor layer RF1 and the second phosphor layer RF2 can effectively absorb the light output from the second blue light emitting element BLED2. Similarly to the second embodiment, the third embodiment can make the thickness to of the first phosphor layer RF1 thinner.

Similarly to the second embodiment, the third embodiment has a configuration in which the first phosphor layer RF1 and the second phosphor layer RF2 are stacked. The present embodiment is not limited thereto, and the phosphor layer RF may be provided on the second flattening layer LL2 similarly to the first embodiment. In this case, the third reflective layer RFL3 is provided on the second flattening layer LL2 and covers the cathode electrode CD. The third reflective layer RFL3 may have a curved sectional shape so as to turn the traveling direction of reflected light in a predetermined direction, that is, toward the anode electrode inclining part ADb, for example. The third embodiment may also have the configurations according to the first to the fourth modifications.

Fourth Embodiment

Figure 17:
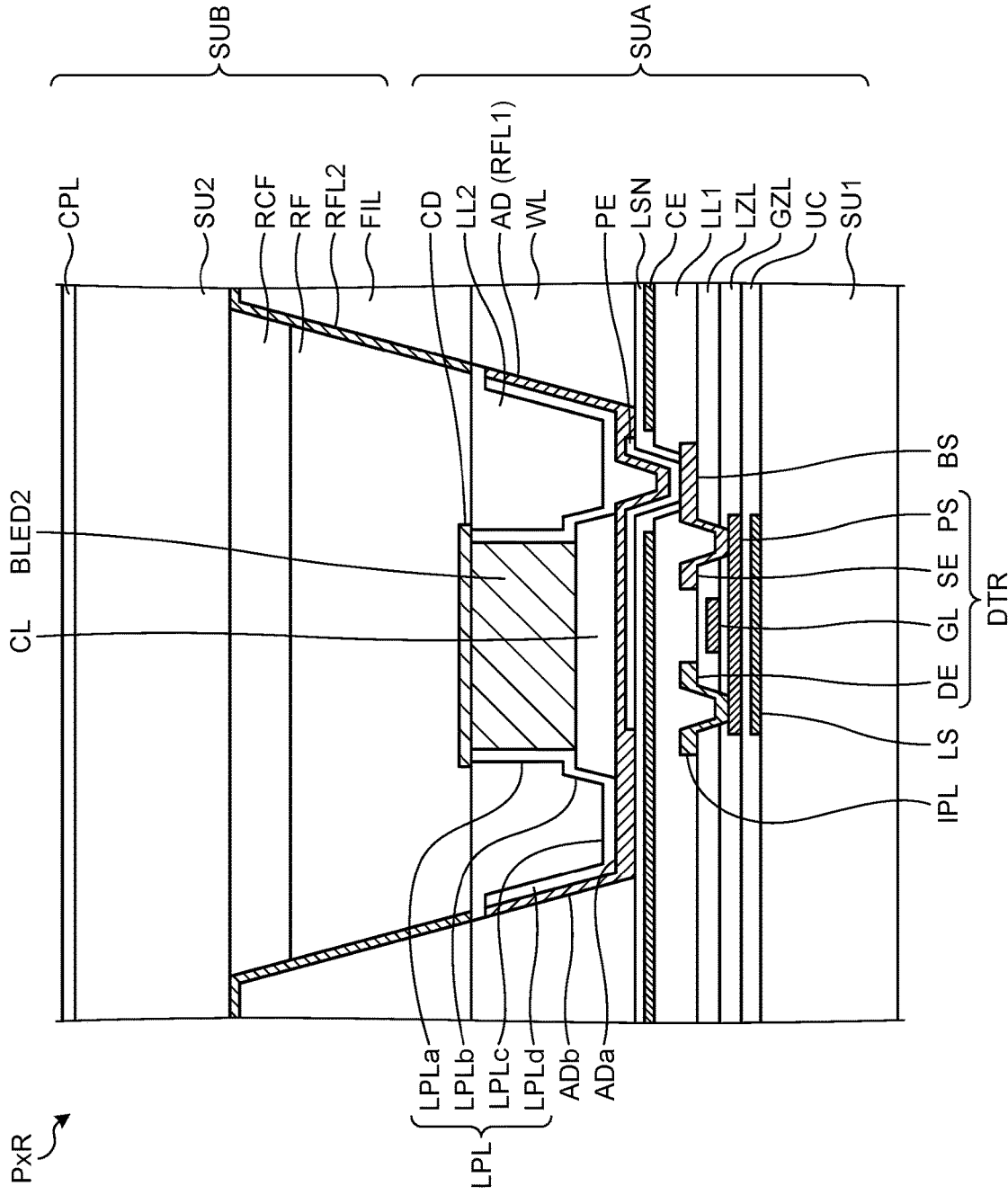
FIG. 17 is a sectional view of the display device according to a fourth embodiment.
Figure 18:
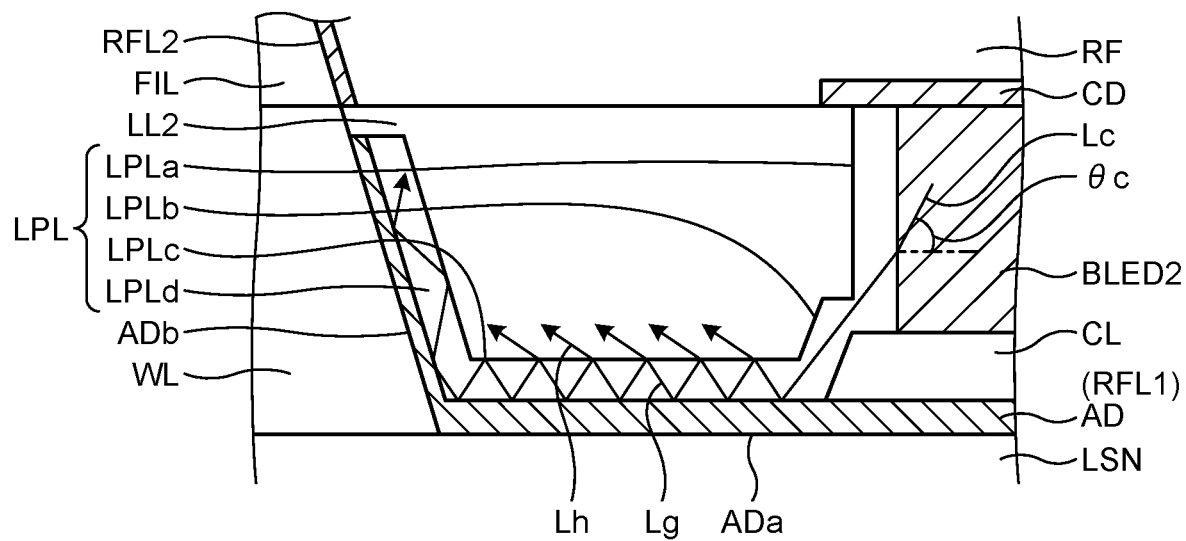
FIG. 18 is a view for explaining a state where light output from the light emitting element propagates in a light extraction layer.

FIG. 17 is a sectional view of the display device according to a fourth embodiment. The first pixel PxR according to the fourth embodiment further includes a light extraction layer LPL. While FIGS. 17 and 18 illustrate the first pixel PxR, the second pixel PxG and the third pixel PxB may also include the light extraction layer LPL.

The light extraction layer LPL is a translucent inorganic insulating layer and is provided to cover at least part of the second blue light emitting element BLED2 and the anode electrode AD. Specifically, the light extraction layer LPL is a titanium oxide layer having a layer thickness of approximately 300 nm, for example. The light extraction layer LPL can be formed by chemical vapor deposition (CVD) after disposing the second blue light emitting element BLED2 on the coupling layer CL and then forming the cathode electrode CD thereon.

The light extraction layer LPL covers the side surfaces of the second blue light emitting element BLED2 and is provided around the second blue light emitting element BLED2. Specifically, the light extraction layer LPL includes a side part LPLa, an inclining part LPLb, an extending part LPLc, and a facing part LPLd. The side part LPLa is provided surrounding the side surfaces of the light emitting element LED. The upper end of the side part LPLa is provided under the cathode electrode CD. The inclining part LPLb is coupled to the lower end of the side part LPLa and provided between the side part LPLa and the extending part LPLc. The inclining part LPLb is provided along the side surfaces of the coupling layer CL and inclines with respect to the side part LPLa.

The extending part LPLc is provided on the anode electrode bottom part ADa of the anode electrode AD and coupled to the lower end of the inclining part LPLb. In other words, the anode electrode AD is provided between the capacitance nitride film LSN and the extending part LPLc in the normal direction of the first substrate SU1. In other words, the extending part LPLc is provided at the lower end of the side part LPLa and extends toward the outer side of the second blue light emitting element BLED2 than the side part LPLa in planar view, that is, in a direction away from the side surfaces of the second blue light emitting element BLED2.

The facing part LPLd faces the side surfaces of the second blue light emitting element BLED2. Specifically, the facing part LPLd is coupled to the end of the extending part LPLc and provided inclining along the inner wall surface of the wall structure WL and the anode electrode inclining part ADb. The anode electrode inclining part ADb and the facing part LPLd are stacked in order on the inner wall surface of the wall structure WL.

The light extraction layer LPL is provided in the whole region overlapping the anode electrode AD. While the anode electrode inclining part ADb and the facing part LPLd have the same height in FIG. 17, the present embodiment is not limited thereto. The facing part LPLd may be higher than the anode electrode inclining part ADb and cover the upper end of the anode electrode inclining part ADb. The height of the anode electrode inclining part ADb and the facing part LPLd is lower than that of the wall structure WL. In other words, the upper end of the anode electrode inclining part ADb and the upper end of the facing part LPLd are separated from the lower end of the second reflective layer RFL2.

The second flattening layer LL2 is provided to cover the side surfaces of the second blue light emitting element BLED2, the side part LPLa, the inclining part LPLb, the extending part LPLc, and the facing part LPLd. The configuration of the light extraction layer LPL is not limited to that illustrated in FIG. 17 and may be appropriately modified. The light extraction layer LPL, for example, does not necessarily include the facing part LPLd. Alternatively, the light extraction layer LPL may also be provided on the upper surface of the second blue light emitting element BLED2.

FIG. 18 is a view for explaining a state where light output from the light emitting element propagates in the light extraction layer. A total reflection angle θr indicates the likelihood of the light Lc output from the second blue light emitting element BLED2 being incident on an adjacent layer. The total reflection angle θr is an incident angle at which the light Lc generated in the second blue light emitting element BLED2 is totally reflected by the interface with the adjacent layer. An incident angle θc of the light Lc on the side part LPLa is an angle formed by the normal direction of the side surface of the second blue light emitting element BLED2 and the traveling direction of the light Lc. If the incident angle θc is equal to or smaller than the total reflection angle θr, transmitted components are generated. As the total reflection angle θr is larger, the light Lc is more likely to be incident on the adjacent layer.

When the refractive index of the light emitting element LED is $n_{LED}$, and the refractive index of the adjacent layer is $n_{AJ}$, the total reflection angle θr is expressed by Expression (2):

$$\theta r = \arcsin(n_{AJ}/n_{LED}) \quad (2)$$

If $n_{AJ} > n_{LED}$ is satisfied, the light Lc can be incident on the adjacent layer at all the incident angles θc. If $n_{AJ} < n_{LED}$ is satisfied, the total reflection angle θr increases as $n_{AJ}$ increases. As a result, the component of the light Lc incident on the adjacent layer increases.

The side part LPLa of the light extraction layer LPL according to the present embodiment is provided between the side surface of the second blue light emitting element BLED2 and the second flattening layer LL2. The refractive index $n_{LED}$ of the second blue light emitting element BLED2 is 2.4, and the refractive index of the second flattening layer LL2 is 1.5, for example. The refractive index $n_{AJ}$ of the light extraction layer LPL is approximately 2.4 and is larger than the refractive index of the second flattening layer LL2. In other words, the difference between the refractive index of the light extraction layer LPL and the refractive index $n_{LED}$ of the second blue light emitting element BLED2 is smaller than the difference between the refractive index of the second flattening layer LL2 and the refractive index of the second blue light emitting element BLED2. Consequently, the present embodiment has a larger total reflection layer θr at the interface between the second blue light emitting element BLED2 and the side part LPLa than in a case where the second flattening layer LL2 is provided in contact with the side surface of the second blue light emitting element BLED2. As a result, the light Lc output from the second blue light emitting element BLED2 is more likely to be incident on the side part LPLa. While the refractive index $n_{LED}$ of the second blue light emitting element BLED2 is equal to the refractive index $n_{AJ}$ of the light extraction layer LPL, they may be different from each other.

The inclining part LPLb is provided between the side part LPLa and the extending part LPLc. The angle formed by the side part LPLa and the inclining part LPLb and the angle formed by the extending part LPLc and the inclining part LPLb are gentler than in the case where the side part LPLa and the extending part LPLc are directly connected. This structure favorably guides light Lg incident on the side part LPLa to the extending part LPLc via the inclining part LPLb.

The second flatting layer LL2 is provided on the extending part LPLc, and the anode electrode AD is provided under the extending part LPLc. As a result, the light Lg propagates in a direction away from the light emitting element LED while being reflected inside the extending part LPLc. If the incident angle of the light Lg becomes smaller than the total reflection angle on the interface between the extending part LPLc and the second flattening layer LL2 in the propagation process, light Lh is output upward. The light Lg also propagates in the facing part LPLd. If the incident angle of the light Lg becomes smaller than the total reflection angle on the interface between the facing part LPLd and the second flattening layer LL2, the light Lh is output upward. With the light extraction layer LPL, the present embodiment can output the light Lc output from the second blue light emitting element BLED2 toward the second flattening layer LL2 and the phosphor layer RF through the whole surface of the light extraction layer LPL. Consequently, the display device DSP has higher light extraction efficiency.

In addition, the light extraction layer LPL can cause the light Lg to propagate therethrough. Providing the respective light extraction layers LPL to the first pixel PxR, the second pixel PxG, and the third pixel PxB (refer to FIG. 2) can prevent color mixture in the light emitting elements LED.

While the light extraction layer LPL is a titanium oxide layer, for example, the material of the light extraction layer LPL is not limited thereto. The light extraction layer LPL is preferably made of translucent material having a high refractive index. Examples of the material of the light extraction layer LPL include, but are not limited to, tantalum oxide, niobium oxide, barium titanium oxide, etc. The thickness of the light extraction layer LPL is given by way of example only and may be appropriately modified. An ultraviolet absorption layer may be provided between the second substrate SU2 and the circularly polarizing plate CPL. If the light extraction layer LPL is made of titanium oxide, the second flattening layer LL2 may possibly photodegrade because titanium oxide absorbs ultraviolet rays. Providing an ultraviolet absorption layer can reduce the amount of ultraviolet rays incident on the second flattening layer LL2 and prevent photodegradation.

While FIGS. 17 and 18 illustrate the second blue light emitting element BLED2, explanation with reference to FIGS. 17 and 18 is also applicable to the green light emitting element GLED because the refractive index $n_{LED}$ of the green light emitting element GLED is 2.4, for example. In the third pixel PxB and the second pixel PxG, the light Lh is output from the light extraction layer LPL toward the second flattening layer LL2 and the light scattering layer LSL.

Fifth Modification of the Fourth Embodiment

Figure 19:
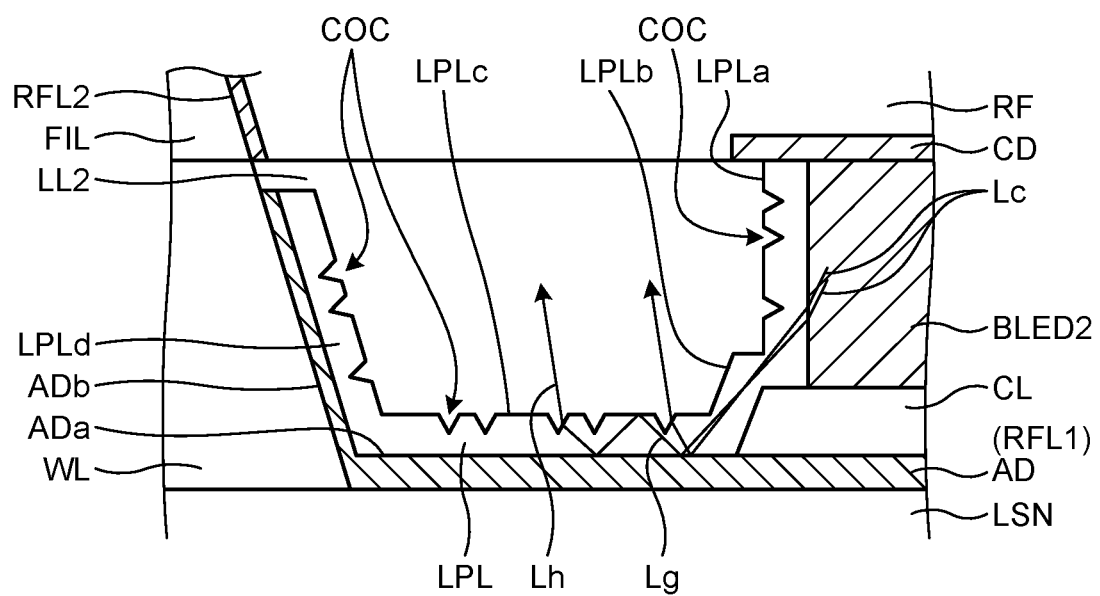
FIG. 19 is an enlarged sectional view of the light extraction layer in the display device according to a fifth modification of the fourth embodiment.

FIG. 19 is an enlarged sectional view of the light extraction layer in the display device according to a fifth modification of the fourth embodiment. As illustrated in FIG. 19, the surface of the light extraction layer LPL according to the fifth modification has a plurality of minute recesses COC. The recesses COC are formed in the side part LPLa, the extending part LPLc, and the facing part LPLd. The recesses COC may be formed in the inclining part LPLb. The recesses COC can be formed by scraping the surface of the light extraction layer LPL. The recesses COC can be formed by a method of spraying an abrasive, such as sandblast, to the light extraction layer LPL, for example.

The light Lg propagating inside the extending part LPLc is reflected in a region having no recess COC on the interface between the extending part LPLc and the second flattening layer LL2. The interface locally inclines at the part having the recess COC, and the incident angle of the light Lg at the part having the recess COC is different from that in the region having no recess COC. Consequently, the light Lh is efficiently output to the second flattening layer LL2 and the phosphor layer RF.

Sixth Modification of the Fourth Embodiment

Figure 20:
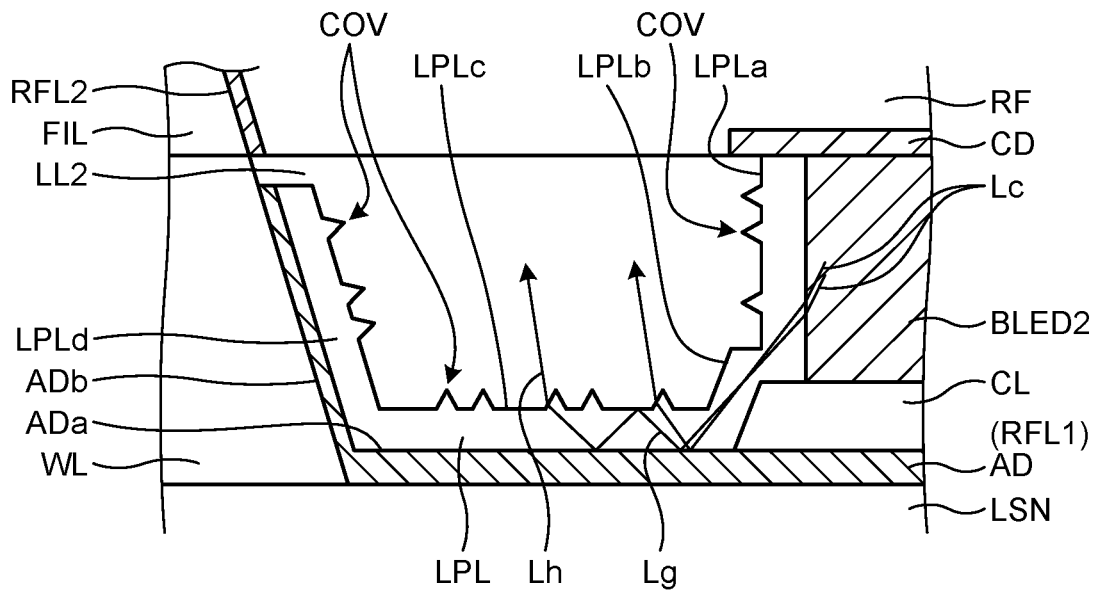
FIG. 20 is an enlarged sectional view of the light extraction layer in the display device according to a sixth modification of the fourth embodiment.

FIG. 20 is an enlarged sectional view of the light extraction layer in the display device according to a sixth modification of the fourth embodiment. As illustrated in FIG. 20, the surface of the light extraction layer LPL according to the sixth modification has a plurality of minute protrusions COV. The protrusions COV are formed on the side part LPLa, the extending part LPLc, and the facing part LPLd. The protrusions COV may be formed on the inclining part LPLb. The protrusions COV can be formed by adhering the same material as that of the light extraction layer LPL, such as minute particles of titanium oxide, to the light extraction layer LPL. More specifically, the protrusions COV are formed by: mixing minute particles of titanium oxide in the organic material of the second flattening layer LL2 to form the second flattening layer LL2, and causing part of the minute particles in the second flattening layer LL2 to adhere to the surface of the light extraction layer LPL.

Also in the sixth modification, the interface locally inclines at the part having the protrusion COV, and the incident angle of the light Lg at the part having the protrusion COV is different from that in the region having no protrusion COV. Consequently, the light Lh is efficiently output to the second flattening layer LL2 and the phosphor layer RF. The configuration is not limited to those illustrated in FIGS. 19 and 20, and the surface of the light extraction layer LPL may have a plurality of minute recesses and protrusions. Specifically, the recesses and protrusions may be formed by roughening the surface of the light extraction layer LPL by reverse sputtering, for example.

Seventh Modification of the Fourth Embodiment

Figure 21:
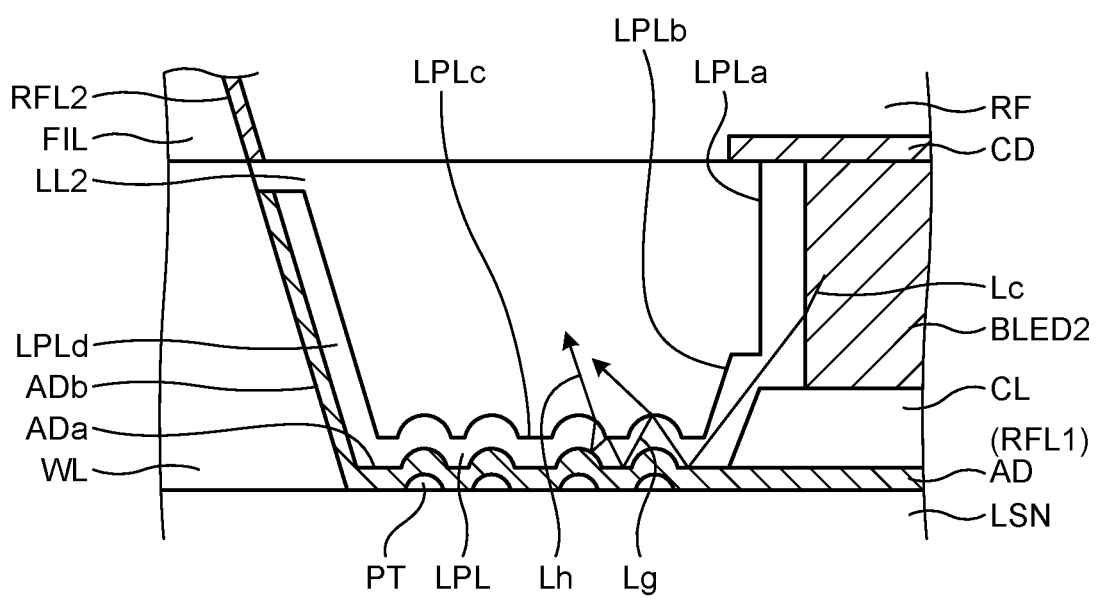
FIG. 21 is an enlarged sectional view of the light extraction layer in the display device according to a seventh modification of the fourth embodiment.

FIG. 21 is an enlarged sectional view of the light extraction layer in the display device according to a seventh modification of the fourth embodiment. As illustrated in FIG. 21, the seventh modification has a plurality of protrusion structures PT on the capacitance nitride film LSN. The protrusion structures PT can be formed by patterning an organic resist on the capacitance nitride film LSN. The organic resist is then heated to be melted and solidified. As a result, the protrusion structures PT are each formed into a semicircular sectional structure having a curved surface.

The anode electrode AD and the extending part LPLc are provided on the capacitance nitride film LSN and the protrusion structures PT. The part of the anode electrode AD overlapping the extending part LPLc has a plurality of protrusions along the shape of the protrusion structures PT. The surface of the extending part LPLc also has a plurality of protrusions along the shape of the protrusion structures PT.

With this structure, the interface between the anode electrode AD and the extending part LPLc locally inclines at the part having the protrusions, and the reflection angle of the light Lg differs. As a result, the traveling direction of the light Lg differs between the part having the protrusions and the part not having the protrusions. This structure increases the component of the light Lg traveling in the normal direction of the interface between the extending part LPLc and the second flattening layer LL2, thereby enabling the light Lh to pass through the second flattening layer LL2. The interface between the extending part LPLc and the second flattening layer LL2 also locally inclines at the part having the protrusions. As a result, the incident angle of the light Lg differs between the part having the protrusions and the part not having the protrusions. Consequently, the light Lh is efficiently output to the second flattening layer LL2 and the phosphor layer RF.

Eighth Modification of the Fourth Embodiment

Figure 22:
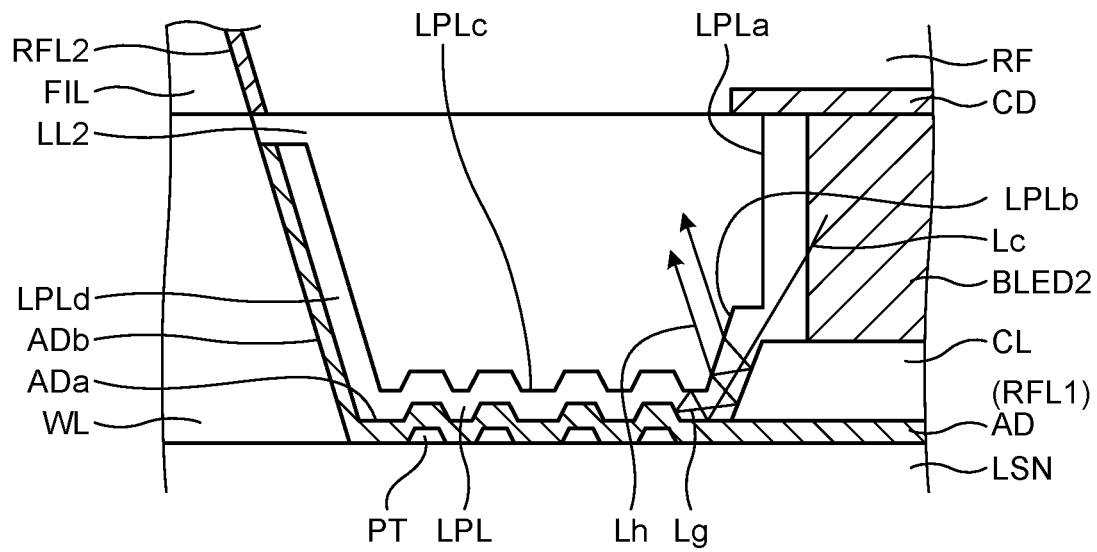
FIG. 22 is an enlarged sectional view of the light extraction layer in the display device according to an eighth modification of the fourth embodiment.

FIG. 22 is an enlarged sectional view of the light extraction layer of the display device according to an eighth modification of the fourth embodiment. As illustrated in FIG. 22, the protrusion structures PT on the capacitance nitride film LSN according to the eighth modification each have a trapezoidal sectional structure. The protrusion structure PT can be formed by heating at a temperature lower than the melting temperature of the organic resist.

Also in the eighth modification, the anode electrode AD and the extending part LPLc have a plurality of protrusions along the shape of the protrusion structures PT. The light Lg is partially reflected by the side surface of the protrusion formed on the anode electrode AD and changes its traveling direction. The light Lg reflected by the side surface of the protrusion is further reflected by the surface of the coupling layer CL. The light Lh is then output upward from the inclining part LPLb. To simplify the drawing, FIG. 22 does not illustrate the light Lg traveling inside the extending part LPLc. Also in the eighth modification, the light Lh is efficiently output to the second flattening layer LL2 and the phosphor layer RF with the protrusions formed on the anode electrode AD and the extending part LPLc similarly to the seventh modification.

The fourth embodiment and the fifth to the eighth modifications may also have the configurations according to the first to the fourth modifications of the first embodiment, the second embodiment, and the third embodiment.

Fifth Embodiment

Figure 23:
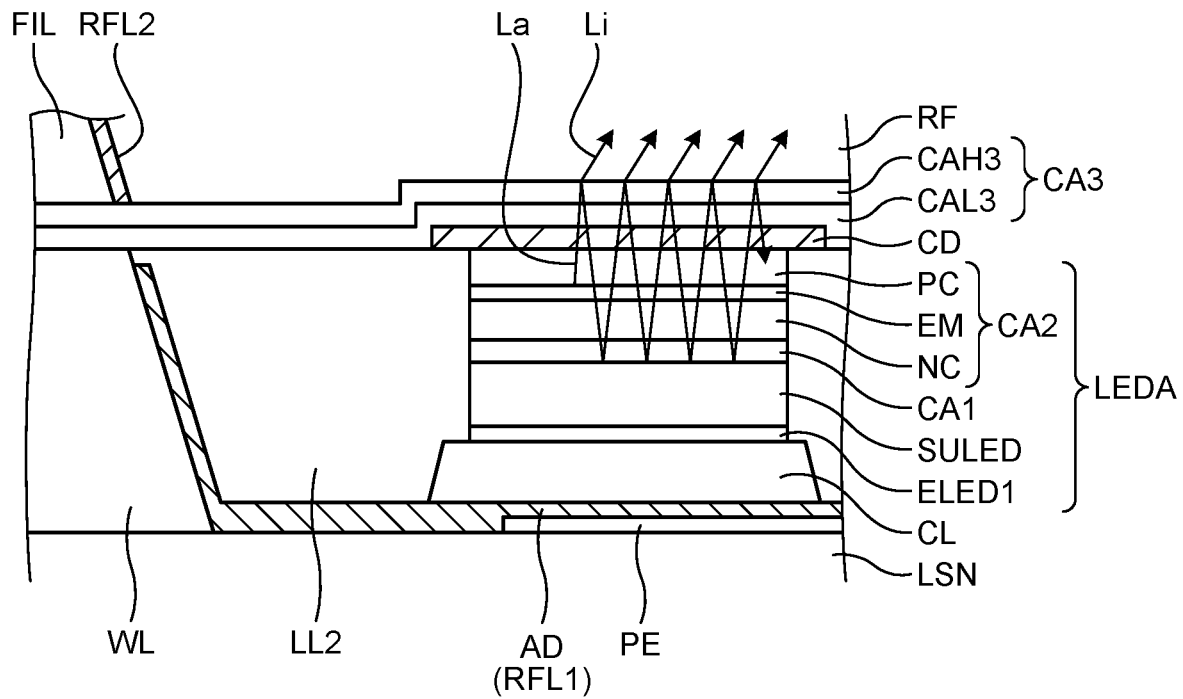
FIG. 23 is a sectional view of the display device according to a fifth embodiment.

FIG. 23 is a sectional view of the display device according to a fifth embodiment. As illustrated in FIG. 23, the display device DSP according to the fifth embodiment further includes a first resonant layer CA1, a second resonant layer CA2, and a third resonant layer CA3. The first resonant layer CA1 and the second resonant layer CA2 are provided in a light emitting element LEDA. Specifically, the first resonant layer CA1 is provided between the light emitting element substrate SULED and the n-type cladding layer NC. The first resonant layer CA1 is one dielectric layer. The material of the first resonant layer CA1 may be a silicon oxide film having a low refractive index. The layer thickness of the first resonant layer CA1 in the green light emitting element GLED is approximately 174 nm, and that in the first blue light emitting element BLED1 and the second blue light emitting element BLED2 is approximately 154 nm.

The second resonant layer CA2 is obtained by adjusting the layer thickness of the n-type cladding layer NC, the light emitting layer EM, and the p-type cladding layer PC. The layer thickness of the second resonant layer CA2 is a value obtained by dividing one-half of the main emission wavelength of light emitted from the light emitting element LEDA by the refractive index. In other words, when the layer thickness of the second resonant layer CA2 is $d_2$, the main emission wavelength of light emitted from the light emitting element LEDA is $\lambda$, and the refractive index of the second resonant layer CA2 is $n_2$, the layer thickness $d_2$ is expressed by Expression (3):

$$d_2 = i\lambda/2n_2 \quad (3)$$

where i is a positive integer.

The third resonant layer CA3 is provided on the light emitting element LEDA and the second flattening layer LL2. The cathode electrode CD, the third resonant layer CA3, and the phosphor layer RF are stacked in order on the light emitting element LEDA. In other words, the third resonant layer CA3 is provided between the group of the anode electrode AD (first reflective layer RFL1) and the light emitting element LEDA and the group of the phosphor layer RF and the second reflective layer RFL2.

The third resonant layer CA3 includes one low-refractive-index dielectric layer CAL3 and one high-refractive-index dielectric layer CAH3. The low-refractive-index dielectric layer CAL3 is a silicon oxide film having the same layer thickness as that of the first resonant layer CA1. The high-refractive-index dielectric layer CAH3 is made of titanium oxide. The layer thickness of the high-refractive-index dielectric layer CAH3 in the green light emitting element GLED is approximately 86 nm, and that in the first blue light emitting element BLED1 and the second blue light emitting element BLED2 is approximately 76 nm.

The resonator structure according to the present embodiment is composed of the first resonant layer CA1 and the second resonant layer CA2 provided in the light emitting element LEDA and the third resonant layer CA3 provided outside the light emitting element LEDA. With this configuration, light La output upward from the light emitting layer EM is incident on the third resonant layer CA3. Partial light Li of the light La passes through the third resonant layer CA3 and is output to above the light emitting element LEDA, and other partial light returns to the light emitting layer EM. The light returning to the light emitting layer EM is reflected by the first resonant layer CA1. The light La is repeatedly reflected a plurality of times between the third resonant layer CA3 and the first resonant layer CA1.

A layer thickness $d_3$ of the low refractive index dielectric layer CAL3 or the high refractive index dielectric layer CAH3 of the third resonant layer CA3 is expressed by Expression (4):

$$d_3 = i\lambda/2n_3 \quad (4)$$

where $n_3$ is the refractive index of the low refractive index dielectric layer CAL3 or the high refractive index dielectric layer CAH3.

Light rays reflected by the interfaces are in phase and intensify each other. Accordingly, the emission intensity of the light Li reflected by the first resonant layer CA1 and the third resonant layer CA3 and output upward increases.

The layer thickness $d_3$ of the low refractive index dielectric layer CAL3 and the high refractive index dielectric layer CAH3 is obtained when i=1 is satisfied in Expression (4). As i becomes larger, the incident angle dependence and the emission wavelength dependence of the light Li output from the resonator structure becomes steeper. As a result, the emission component in the normal direction increases, and the half width decreases. Consequently, the display device DSP has higher color purity. As i becomes larger, however, it is necessary to make the layer thickness of the resonator structure larger, resulting in an increase in the manufacturing cost. For this reason, i is preferably set to 1.

The absorption spectrum of the phosphor layer RF has the maximum wavelength. Combining the phosphor layer RF and the resonator structure reduces the half width of the light Li output from the resonator structure. As a result, the absorption spectrum can cause a larger amount of light near the maximum wavelength to be incident on the phosphor layer RF. This mechanism increases the conversion efficiency of the phosphor layer RF. Consequently, the thickness of the phosphor layer RF can be reduced.

The high-refractive-index dielectric layer CAH3 is not necessarily made of titanium oxide and may be made of tantalum oxide, niobium oxide, or barium titanium oxide, for example. The low-refractive-index dielectric layer CAL3 may be made of aluminum oxide, calcium fluoride, or magnesium fluoride, for example. The first resonant layer CA1 may be provided with a high-reflectance metal film, on the low-refractive-index layer such as an aluminum film, because the first resonant layer CA1 reflects light having the main wavelength of a light emitting element LEDA.

Ninth Modification of the Fifth Embodiment

Figure 24:
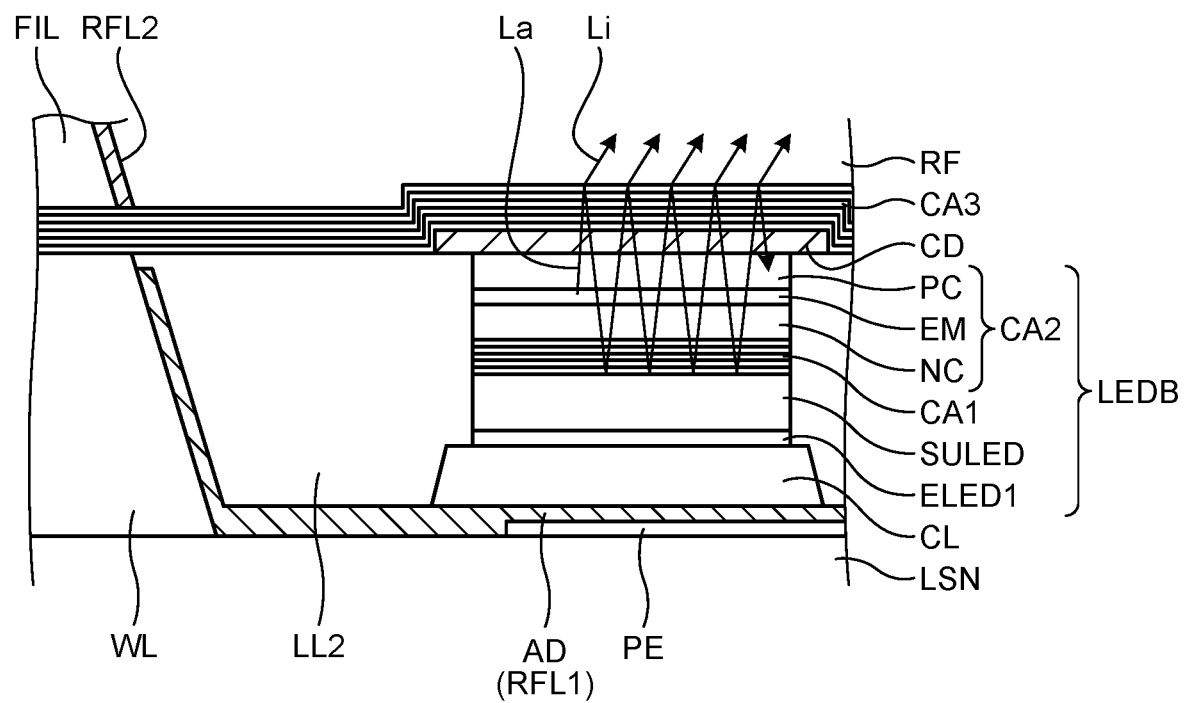
FIG. 24 is a sectional view of the display device according to a ninth modification of the fifth embodiment.

FIG. 24 is a sectional view of the display device according to a ninth modification of the fifth embodiment. As illustrated in FIG. 24, a light emitting element LEDB according to the ninth modification includes the first resonant layer CA1 composed of five dielectric layers. In the first resonant layer CA1, the dielectric layers are stacked on the light emitting element substrate SULED in order of a low-refractive-index layer, a high-refractive-index layer, a low-refractive-index layer, a high-refractive-index layer, and a low-refractive-index layer. The third resonant layer CA3 is composed of six dielectric layers. In the third resonant layer CA3, the dielectric layers are stacked on the cathode electrode CD and the second flattening layer LL2 in order of a low-refractive-index layer, a high-refractive-index layer, a low-refractive-index layer, a high-refractive-index layer, a low-refractive-index layer, and a high-refractive-index layer. The high-refractive-index layer is provided in the uppermost layer of the third resonant layer CA3.

Consequently, the display device DSP including the light emitting element LEDB has higher intensity of the emission spectrum and a smaller half width in all the wavelengths of red (R), green (G), and blue (B) than the display device DSP including the light emitting element LEDA. The display device DSP including the light emitting element LEDB has higher emission intensity in the normal direction than the display device DSP including the light emitting element LEDA. By increasing the number of layers of the first resonant layer CA1 and the third resonant layer CA3, the display device DSP has higher emission intensity and a smaller half width in the normal direction and can display brighter light color. Consequently, the display device DSP can achieve higher display performance in the normal direction in which a user more frequently observes the display device DSP when using it.

The number of layers and the layer thickness of the resonant layers according to the fifth embodiment and the ninth modification are given by way of example only and may be appropriately modified. The number of layers of the third resonant layer CA3 according to the ninth modification, for example, may be five or less or seven or more. The fifth embodiment and the ninth modification may also have the configurations according to the second to the fourth embodiments and the first to the eighth modifications. In the display device DSP according to the second modification of the first embodiment illustrated in FIG. 12, for example, the same blue light emitting elements BLED are used for the first pixel PxR, the second pixel PxG, and the third pixel PxB. With this configuration, it is unnecessary to vary the film thickness of the resonator structure depending on the pixels. Consequently, the multilayered structure can be formed in a relatively simple manner.

Sixth Embodiment

Figure 25:
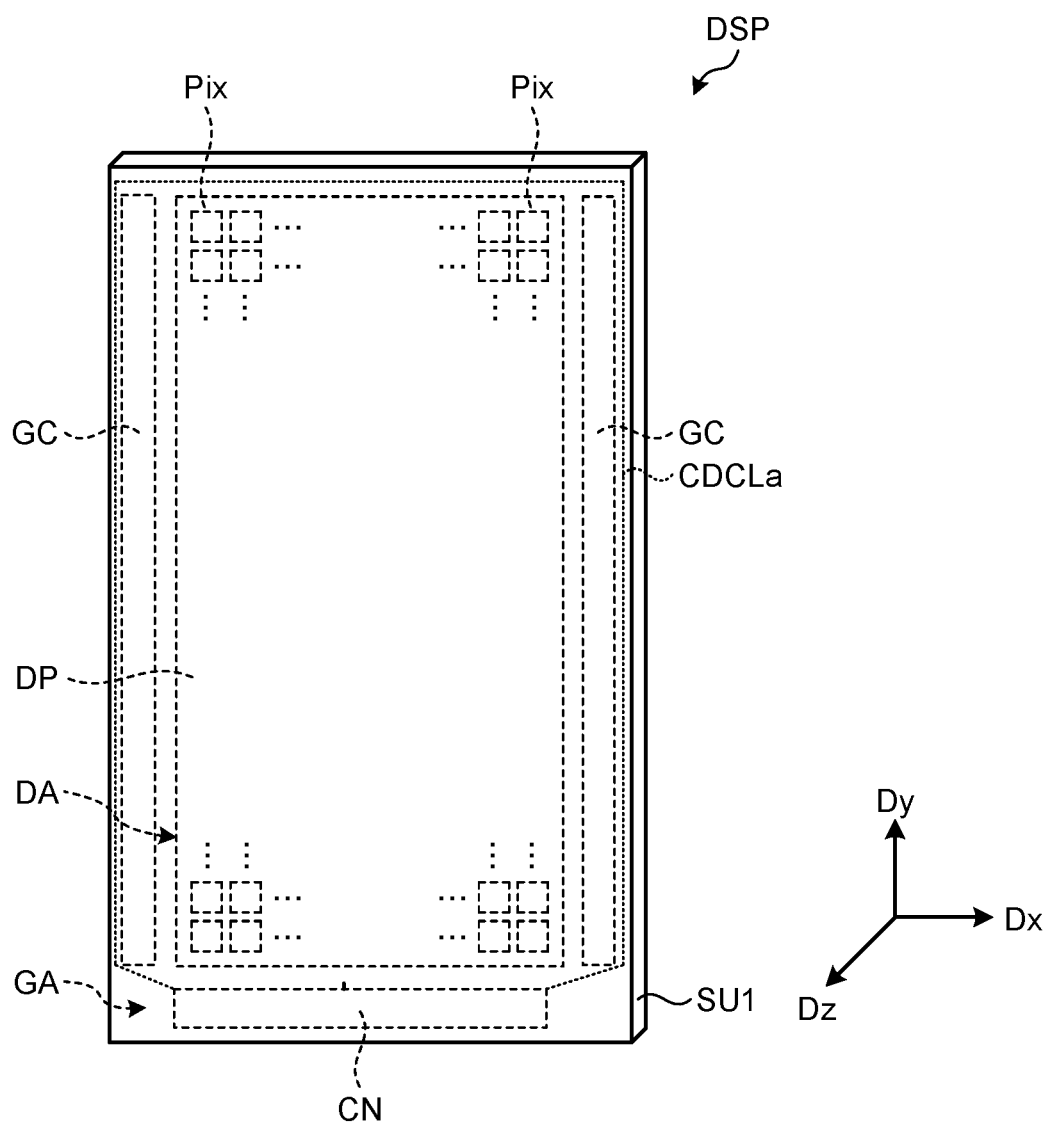
FIG. 25 is a perspective view schematically illustrating the display device according to a sixth embodiment.
Figure 26:
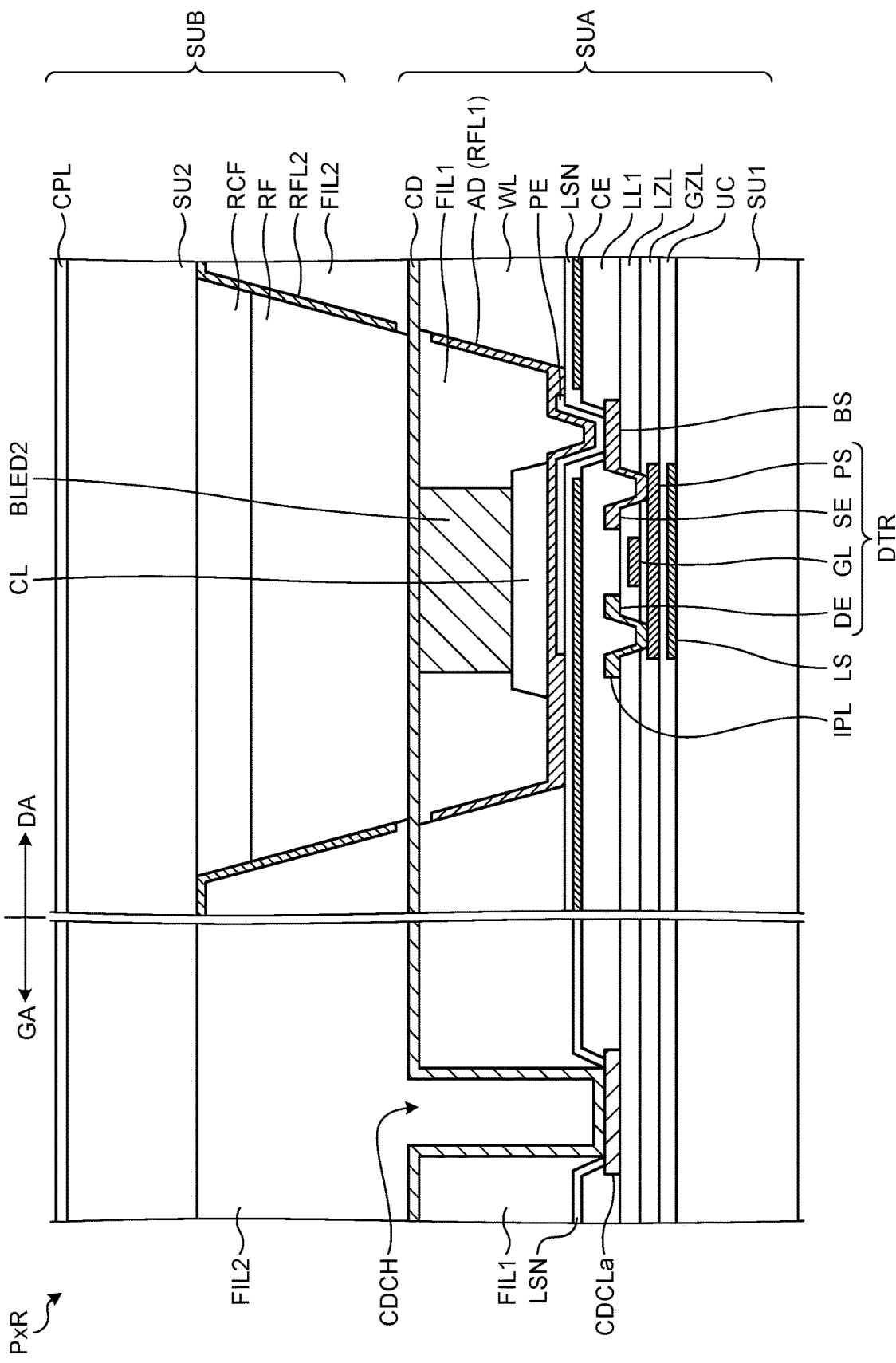
FIG. 26 is a sectional view of the display device according to the sixth embodiment.

FIG. 25 is a perspective view schematically illustrating the display device according to a sixth embodiment. FIG. 26 is a sectional view of the display device according to the sixth embodiment. To simplify the drawing, FIG. 25 does not illustrate the second substrate SU2. FIG. 26 schematically illustrates a sectional structure of the first pixel PxR and a sectional structure of a coupling part of the cathode electrode CD in the peripheral region GA.

As illustrated in FIG. 25, the display device DSP includes a cathode coupling line CDCLa. The cathode coupling line CDCLa is provided in the peripheral region GA of the first substrate SU1 in a manner surrounding the display portion DP and the peripheral circuits GC. The cathode coupling line CDCLa is coupled to the coupler CN and supplied with the cathode power supply potential PVSS from the external drive IC.

As illustrated in FIG. 26, the first pixel PxR includes a first filling layer FIL1 in the recess formed by the wall structure WL and the anode electrode AD. A second filling layer FIL2 is provided between the second reflective layer RFL2 on the second substrate SU2 and the cathode electrode CD. The first filling layer FIL1 and the second filling layer FIL2 are provided between the capacitance nitride film LSN on the first substrate SU1 and the second substrate SU2 in the peripheral region GA. The first filling layer FIL1 and the second filling layer FIL2 are made of light-resistant resin material and made of epoxy resin or silicone resin (dimethyl silicone resin or phenyl silicone resin), for example.

The cathode electrode CD is continuously provided from the display region DA to the peripheral region GA. With this configuration, the light emitting elements LED provided to the respective pixels Px are electrically coupled to the common cathode electrode CD. Specifically, the cathode electrode CD is provided on the second blue light emitting element BLED2, the first filling layer FILL and the wall structure WL. The cathode electrode CD is provided between the phosphor layer RF and the group of the second blue light emitting element BLED2 and the first filling layer FIL1 in the normal direction of the first substrate SU1 and between the second filling layer FIL2 and the wall structure WL.

The lower end of the second reflective layer RFL2 and the upper end of the anode electrode AD are separated from the cathode electrode CD. The second filling layer FIL2 serving as an insulating layer is provided between the cathode electrode CD and the lower end of the second reflective layer RFL2. The first filling layer FIL1 serving as an insulating layer is provided between the cathode electrode CD and the upper end of the anode electrode AD.

The cathode coupling line CDCLa is provided on the interlayer insulating film LZL in the peripheral region GA.

A cathode contact hole CDCH is formed in a region overlapping the cathode coupling line CDCLa in the first filling layer FIL1 and the first flattening layer LL1. The cathode electrode CD is electrically coupled to the cathode coupling line CDCLa through the cathode contact hole CDCH.

In the configuration according to the present embodiment, the cathode coupling line CDCL (refer to FIG. 6) that couples a plurality of light emitting elements LED and the cathode electrode CD need not be provided in the display region DA. Consequently, the present embodiment requires a smaller number of wires in the pixels Px.

Tenth Modification of the Sixth Embodiment

FIG. 27 is a sectional view of the display device according to a tenth modification of the sixth embodiment. While the first substrate SU1 and the second substrate SU2 according to the embodiments and the modifications above face each other, the configuration is not limited thereto. As illustrated in FIG. 27, the display device DSP according to the tenth modification does not include the second substrate SU2 and includes a third flattening layer LL3 on the color filter RCF and the second reflective layer RFL2. The third flattening layer LL3 is provided over the peripheral region GA and covers the cathode electrode CD.

In the manufacturing process according to the present embodiment, a wall structure WL1, the anode electrode AD, the coupling layer CL, the second blue light emitting element BLED2, the first filling layer FILL and other components are formed on the first substrate SU1, and the cathode electrode CD is then formed. Subsequently, a wall structure WL2, the second reflective layer RFL2, the phosphor layer RF, the color filter RCF, the third flattening layer LL3, and other components are formed on the cathode electrode CD.

The tenth modification has the advantage in reducing the thickness of the display device DSP because it does not include the second substrate SU2. The sixth embodiment and the tenth modification may also have the configurations according to the second to the fifth embodiments and the first to the ninth modifications.

While an exemplary embodiment according to the present disclosure has been described, the embodiment is not intended to limit the disclosure. The contents disclosed in the embodiment are given by way of example only, and various changes may be made without departing from the spirit of the present disclosure. Appropriate changes made without departing from the spirit of the present disclosure naturally fall within the technical scope of the disclosure. At least one of various omissions, substitutions, and changes of the components may be made without departing from the gist of the embodiment above and the modifications thereof.

What is claimed is:

1. A display device comprising:
 a first substrate;
 a plurality of pixels provided to the first substrate;
 a light emitting element provided to each of the pixels;
 a phosphor layer covering at least an upper surface of the light emitting element;
 a first reflective layer facing a side surface of the light emitting element;
 a second reflective layer provided to a side surface of the phosphor layer, separated from the first reflective layer in a normal direction of the first substrate, and disposed farther away from the first substrate than the first reflective layer; and
 wherein the first reflective layer is an anode electrode electrically coupled to the light emitting element.

2. The display device according to claim 1, wherein the first reflective layer and the second reflective layer incline with respect to the normal direction of the first substrate.

3. The display device according to claim 1, further comprising:
 a wall structure facing the side surface of the light emitting element, wherein
 the first reflective layer comprises:
  a bottom part extending from a region overlapping the light emitting element to an area around the light emitting element; and
  an inclining part coupled to the bottom part, provided along a wall surface of the wall structure, and inclining with respect to the normal direction of the first substrate.

4. The display device according to claim 1, further comprising:
 a color filter provided on the phosphor layer, wherein
 the second reflective layer is provided over the side surface of the phosphor layer and a side surface of the color filter.

5. The display device according to claim 1, further comprising:
 a flattening layer covering the side surface of the light emitting element and provided between the light emitting element and the first reflective layer, wherein
 the phosphor layer is provided on the flattening layer.

6. The display device according to claim 1, further comprising:
 a second substrate facing the first substrate, wherein
 the phosphor layer and the second reflective layer are provided to a surface of the second substrate facing the first substrate, and
 the first reflective layer and the light emitting element are provided to a surface of the first substrate facing the second substrate.

7. The display device according to claim 1, wherein
 the phosphor layer comprises a first phosphor layer and a second phosphor layer,
 the first phosphor layer is provided covering at least the upper surface of the light emitting element, and
 the second phosphor layer covers the side surface of the light emitting element and is provided between the first substrate and the first phosphor layer in the normal direction of the first substrate.

8. The display device according to claim 1, further comprising a third reflective layer provided between the upper surface of the light emitting element and the phosphor layer.

9. The display device according to claim 1, wherein
 the pixels include a first pixel configured to display red, a second pixel configured to display green, and a third pixel configured to display blue, and
 the first pixel is provided with a blue light emitting element configured to output blue light and a phosphor layer configured to convert light output from the blue light emitting element into red light.

10. The display device according to claim 9, wherein the second pixel is provided with a blue light emitting element configured to output blue light and a phosphor layer configured to convert light output from the blue light emitting element into green light.

11. The display device according to claim 1, wherein
 the pixels include a first pixel configured to display red, a second pixel configured to display green, and a third pixel configured to display blue, the phosphor layer includes 4-(Dicyanomethylene)-2-methyl-6-(4-dimethylaminostyryl)-4H-pyran (DCM), and the first pixel is provided with a green light emitting element configured to output green light.

12. The display device according to claim 1, further comprising an inorganic insulating layer having translucency and covering at least part of the light emitting element and the first reflective layer.

13. The display device according to claim 12, wherein a plurality of recesses or a plurality of protrusions are provided on a surface of the inorganic insulating layer.

14. The display device according to claim 12, wherein a plurality of protrusions are provided at a part of the first reflective layer overlapping the inorganic insulating layer.

15. The display device according to claim 1, further comprising a resonant layer provided between a group of the first reflective layer and the light emitting element and a group of the phosphor layer and the second reflective layer and comprising a plurality of stacked dielectric layers.

16. The display device according to claim 1, wherein
the light emitting element includes a first resonant layer and a second resonant layer, and
a third resonant layer comprising a plurality of stacked dielectric layers is provided on the light emitting element and the first reflective layer.

17. The display device according to claim 16, wherein
the first resonant layer is provided between a substrate of the light emitting element and a light emitting layer of the light emitting element, and
the second resonant layer comprises the light emitting layer and a cladding layer of the light emitting element.

* * * * *